(12) United States Patent
Shima et al.

(10) Patent No.: US 9,276,593 B2
(45) Date of Patent: Mar. 1, 2016

(54) INJECTION LOCKED OSCILLATOR

(71) Applicant: PANASONIC CORPORATION, Osaka (JP)

(72) Inventors: Takahiro Shima, Kanagawa (JP); Hiroshi Komori, Shiga (JP); Takeaki Watanabe, Kyoto (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 14/398,652

(22) PCT Filed: Feb. 24, 2014

(86) PCT No.: PCT/JP2014/000961
§ 371 (c)(1),
(2) Date: Nov. 3, 2014

(87) PCT Pub. No.: WO2014/136399
PCT Pub. Date: Sep. 12, 2014

(65) Prior Publication Data
US 2015/0091658 A1    Apr. 2, 2015

(30) Foreign Application Priority Data

Mar. 5, 2013  (JP) .................................. 2013-043497

(51) Int. Cl.
*H03L 7/24*    (2006.01)
*H03L 7/099*   (2006.01)
*H03K 3/03*    (2006.01)
*H03L 7/085*   (2006.01)

(52) U.S. Cl.
CPC ............ *H03L 7/0995* (2013.01); *H03K 3/0315* (2013.01); *H03L 7/085* (2013.01); *H03L 7/24* (2013.01)

(58) Field of Classification Search
CPC ............. H03L 7/193; H03L 7/00; H03L 7/24; H03B 27/00; H03K 3/0315
USPC .......... 331/57, 46, 55, 51; 327/115, 117, 118, 327/47
See application file for complete search history.

(56) References Cited

U.S. PATENT DOCUMENTS 8,344,765 B2 *   1/2013  Qiao et al. .................... 327/118
2012/0058804 A1  3/2012  Maeda et al.

FOREIGN PATENT DOCUMENTS

JP    61-206308 A     9/1986
WO    2010-134257 A1  11/2010

OTHER PUBLICATIONS

Mizuki Motoyoshi, et al., 58.8/39.2 GHz Dual Modulus Cmos Frequency Divider, IEICE General Conference, School of Engineering, School of Frontier Sciences, The University of Tokyo, 2007.
International Search Report for Application No. PCT/JP2014/000961dated Mar. 13, 2014.

* cited by examiner

*Primary Examiner* — Arnold Kinkead
(74) *Attorney, Agent, or Firm* — Pearne & Gordon LLP

(57) ABSTRACT

An injection locked frequency divider includes a ring oscillator, an input terminal, an output terminal and a control voltage terminal. The ring oscillator has a three-stage cascade connection of a first amplification circuit including an N-channel MOS type transistor and P-channel MOS type transistors, a second amplification circuit configured in the same manner as the first amplification circuit and a third amplification circuit configured likewise. A high frequency signal is input to a gate terminal of each P-channel MOS type transistor. A predetermined DC control voltage is supplied to a gate terminal of each P-channel MOS type transistor.

6 Claims, 15 Drawing Sheets

INJECTION LOCKED OSCILLATOR

TECHNICAL FIELD

The present disclosure relates to an injection locked oscillator which divides or multiplies the frequency of a high frequency signal.

BACKGROUND ART

High throughput is required in a portable wireless communication apparatus that have been spread recently. A PLL (Phase Locked Loop) circuit operating in a high frequency band is required as a frequency synthesizer in wireless communication.

The PLL circuit includes a frequency divider for dividing a high frequency band signal to a low frequency band signal. An ILFD (Injection Locked Frequency Divider) capable of operating at a high speed and with low power consumption in a high frequency band, which is, for example, not lower than 10 [GHz], is used as a divider (for example, see NPL 1). The injection locked frequency divider shown in NPL 1 will be described later with reference to FIG. 11.

CITATION LIST

Non Patent Literature

Non Patent Literature 1: 58.8/39.2 GHz Dual Mode CMOS Frequency Divider, IEICE general conference, 2007

SUMMARY OF INVENTION

Technical Problem

In the configuration of the injection locked frequency divider disclosed in NPL 1, there is, however, a problem that, when the amplitude (e.g. voltage amplitude) of an injection signal is larger than a predetermined value, the frequency divider does not operate as a divider dividing the frequency of the injection signal by a predetermined dividing number, but outputs a predetermined oscillation frequency (hereinafter referred to as "free running frequency").

In order to solve the foregoing problem belonging to the background art, an object of the present disclosure is to provide an injection locked oscillator which operates stably as an oscillator and widen the bandwidth of an operation frequency even if the amplitude of an injection signal is larger than a predetermined value.

Solution to Problem

According to the present disclosure, an injection locked oscillator includes: a ring oscillator including a cascade connection of (2n+1) stages (n is an integer of 1 or more) of amplification circuits each having an N-channel MOS type transistor, a first P-channel MOS type transistor and a second P-channel MOS type transistor, wherein a high frequency signal is input to a gate terminal of the first P-channel MOS type transistor in each of the (2n+1) amplification circuits, and a predetermined DC control voltage is supplied to a gate terminal of the second P-channel MOS type transistor in each of the (2n+1) amplification circuits.

In addition, according to the present disclosure, an injection locked oscillator includes: a ring oscillator including a cascade connection of (2n+1) stages (n is an integer of 1 or more) of amplification circuits each having an N-channel MOS type transistor and a P-channel MOS type transistor; a first N-channel MOS type transistor which is connected to the N-channel MOS type transistor in each of the (2n+1) amplification circuits; and a second N-channel MOS type transistor which is connected to the N-channel MOS type transistor in each of the (2n+1) amplification circuits; wherein a high frequency signal is input to a gate terminal of the first N-channel MOS type transistor, and a predetermined DC control voltage is supplied to a gate terminal of the second N-channel MOS type transistor.

Advantageous Effects of Invention

According to the present disclosure, the oscillator operate stably as an oscillator and widen the bandwidth of an operation frequency even if the amplitude of an injection signal is larger than a predetermined value.

BRIEF DESCRIPTION OF DRAWINGS

FIG. 14(A) shows the time characteristic of the gate voltage amplitude of a P-channel MOS type transistor; FIG. 14(B) shows the time characteristic of the drain voltage amplitude of the P-channel MOS type transistor; and FIG. 14(C) shows the time characteristic of the drain current of the P-channel MOS type transistor.

FIG. 15(A) shows the time characteristic of the gate voltage amplitude of a P-channel MOS type transistor; FIG. 15(B) shows the time characteristic of the drain voltage amplitude of the P-channel MOS type transistor; and FIG. 15(C) shows the time characteristic of the drain current of the P-channel MOS type transistor.

DESCRIPTION OF EMBODIMENTS (Background of Contents of Each Embodiment)

Figure 11:
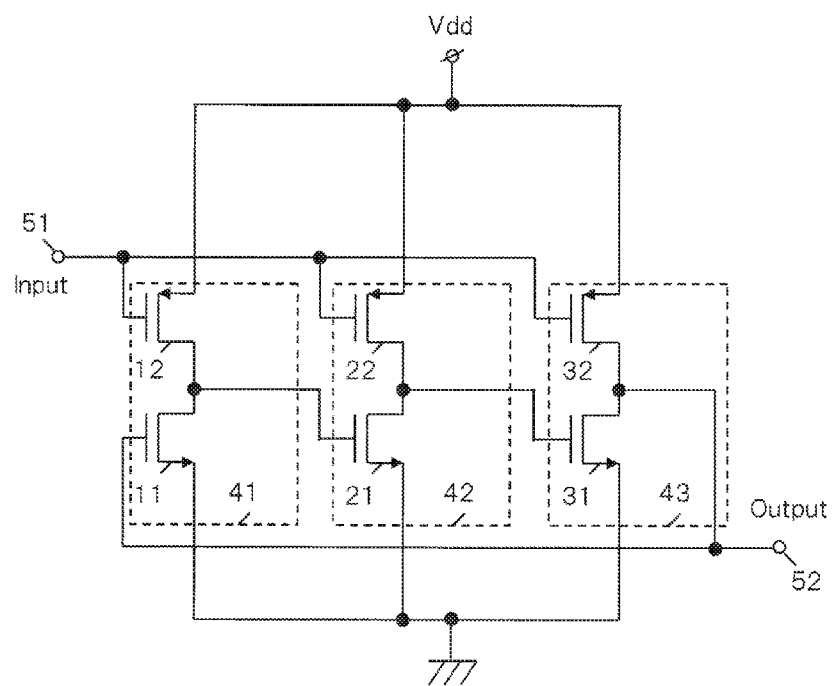
FIG. 11 is a diagram showing the circuit configuration of an injection locked frequency divider according to the background art.

First, the background of the contents of each embodiment of an injection locked oscillator according to the present disclosure will be described with reference to FIGS. 11 to 15 before the embodiment is described. FIG. 11 is a diagram showing the circuit configuration of an injection locked frequency divider 10 according to the background art.

The injection locked frequency divider 10 shown in FIG. 11 includes a ring oscillator, an input terminal 51 and an output terminal 52. In the ring oscillator, a three-stage cascade connection of a first amplification circuit 41, a second amplification circuit 42 and a third amplification circuit 43 is formed on a loop.

The first amplification circuit 41 includes an N-channel MOS (Metal Oxide Semiconductor) type transistor 11 whose gate terminal receives a feedback output of the third amplification circuit 43, and a P-channel MOS type transistor 12 serving as a load.

The second amplification circuit 42 includes an N-channel MOS type transistor 21 whose gate terminal receives an output of the first amplification circuit 41, and a P-channel MOS type transistor 22 serving as a load.

The third amplification circuit 43 includes an N-channel MOS type transistor 31 whose gate terminal receives an output of the second amplification circuit 42, and a P-channel MOS type transistor 32 serving as a load.

Gate terminals of the P-channel MOS type transistors 12, 22 and 32 are connected to the input terminal 51. Source terminals of the P-channel MOS type transistors 12, 22 and 32 are connected to a high potential power source Vdd. Source terminals of the N-channel MOS type transistors 11, 21 and 31 are grounded.

Figure 12:
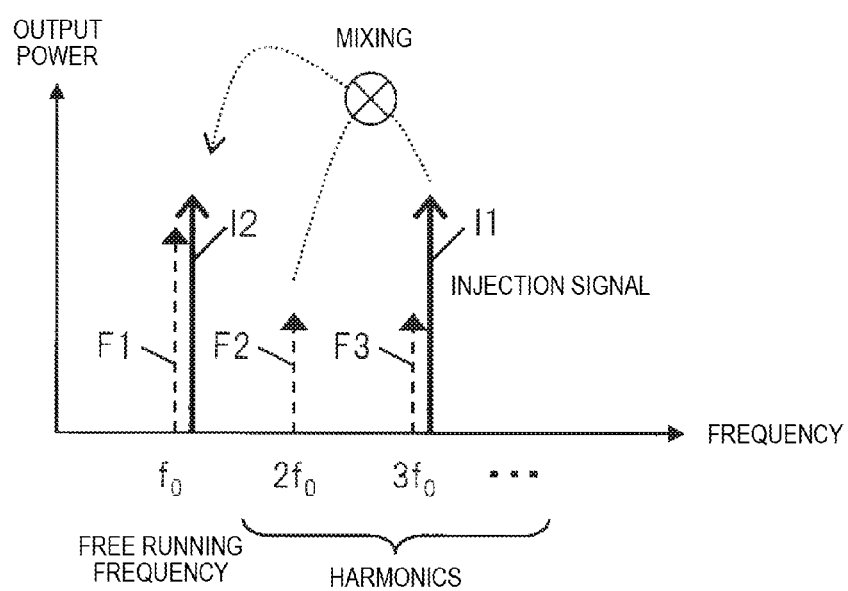
FIG. 12 is a graph showing the relationship between the frequency and the electric power in an injection signal and an output signal of the injection locked frequency divider according to the background art.

The operation of the injection locked frequency divider 10 shown in FIG. 11 will be described with reference to FIG. 12. FIG. 12 is a graph showing the relationship between the frequency and the electric power in an injection signal and an output signal of the injection locked frequency divider 10 according to the background art.

In FIG. 12, when there is no injection signal input to the input terminal 51, an oscillation signal (free running signal) F1 of a free running frequency $f_0$, a secondary harmonic component F2 of a frequency $2f_0$ and a tertiary harmonic component F3 of a frequency $3f_0$ appear in the output terminal 52 of the ring oscillator, that is, in the output terminal 52 of the injection locked frequency divider 10.

Next, when an injection signal I1 near the frequency $3f_0$ is input to the input terminal 51, an output signal I2 in which the injection signal I1 has been down-converted appears near the free running frequency $f_0$ due to mixing of the injection signal I1 and the secondary harmonic component F2. Thus, the free running signal F1 of the injection locked frequency divider 10 is attracted toward the frequency of the output signal I2 and synchronized. That is, the injection locked frequency divider 10 outputs the output signal I2 of the frequency $f_0$ in response to the injection signal I1 of the frequency $3f_0$, and serves as a ⅓-divider.

Figure 13:
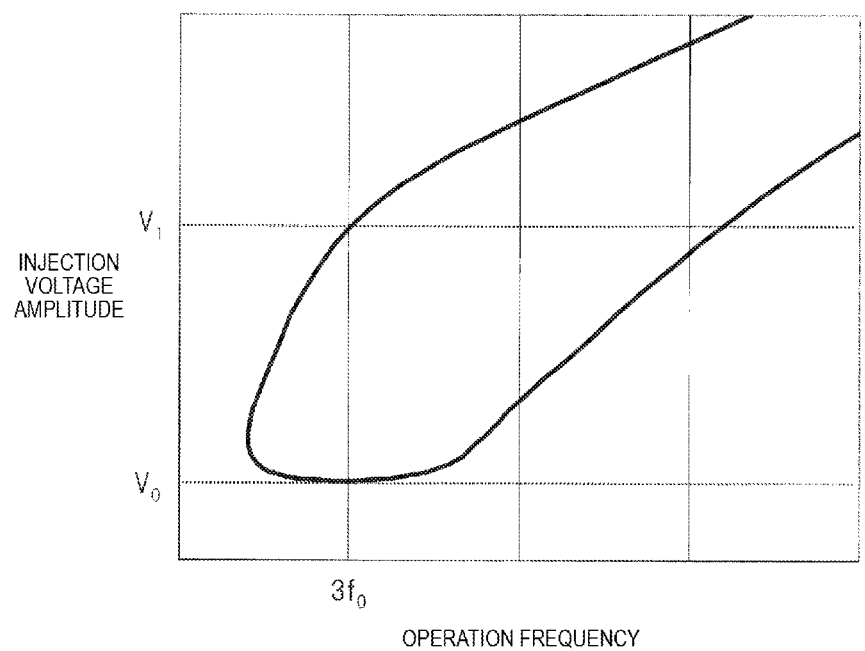
FIG. 13 is a graph showing the relationship between the voltage amplitude of an injection signal and an operation frequency in the injection locked frequency divider according to the background art.
Figure 14:
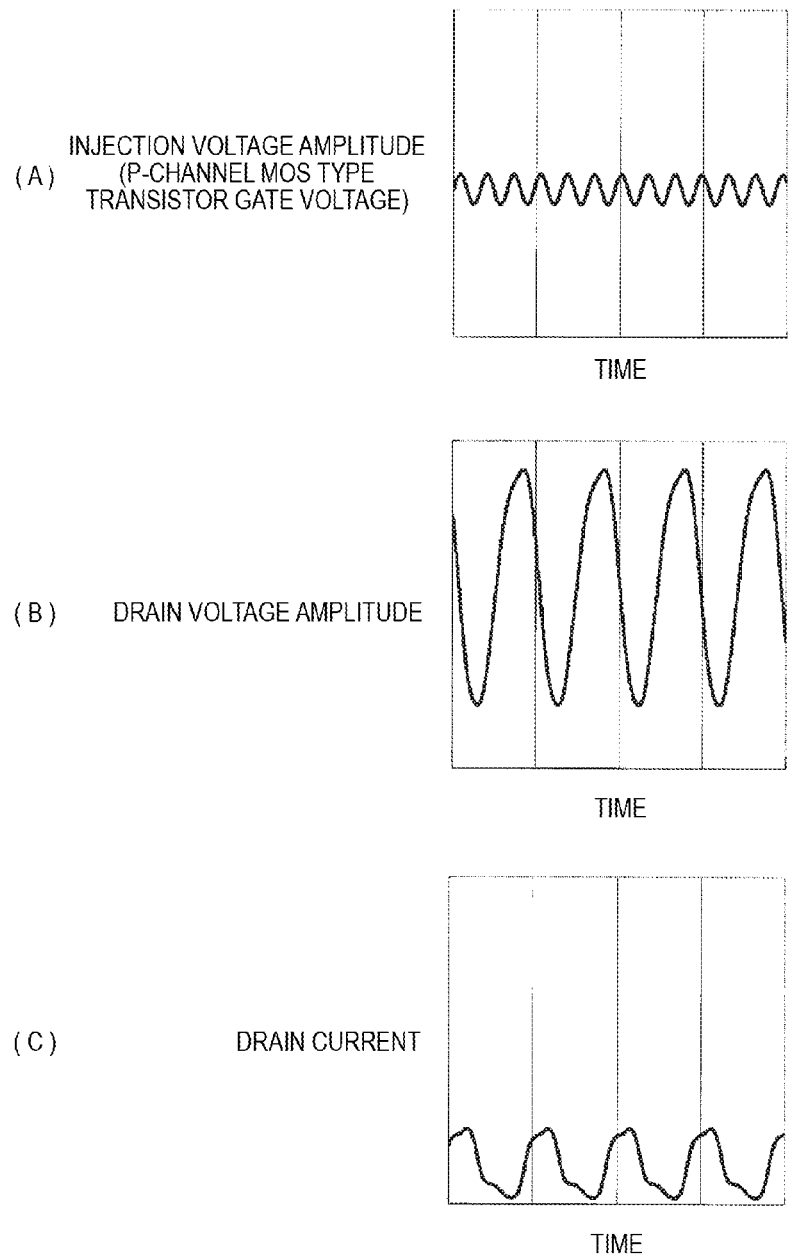
FIGS. 14(A), 14(B), 14(C) are graphs showing time characteristics respectively when the voltage amplitude of an injection signal is small.
Figure 15:
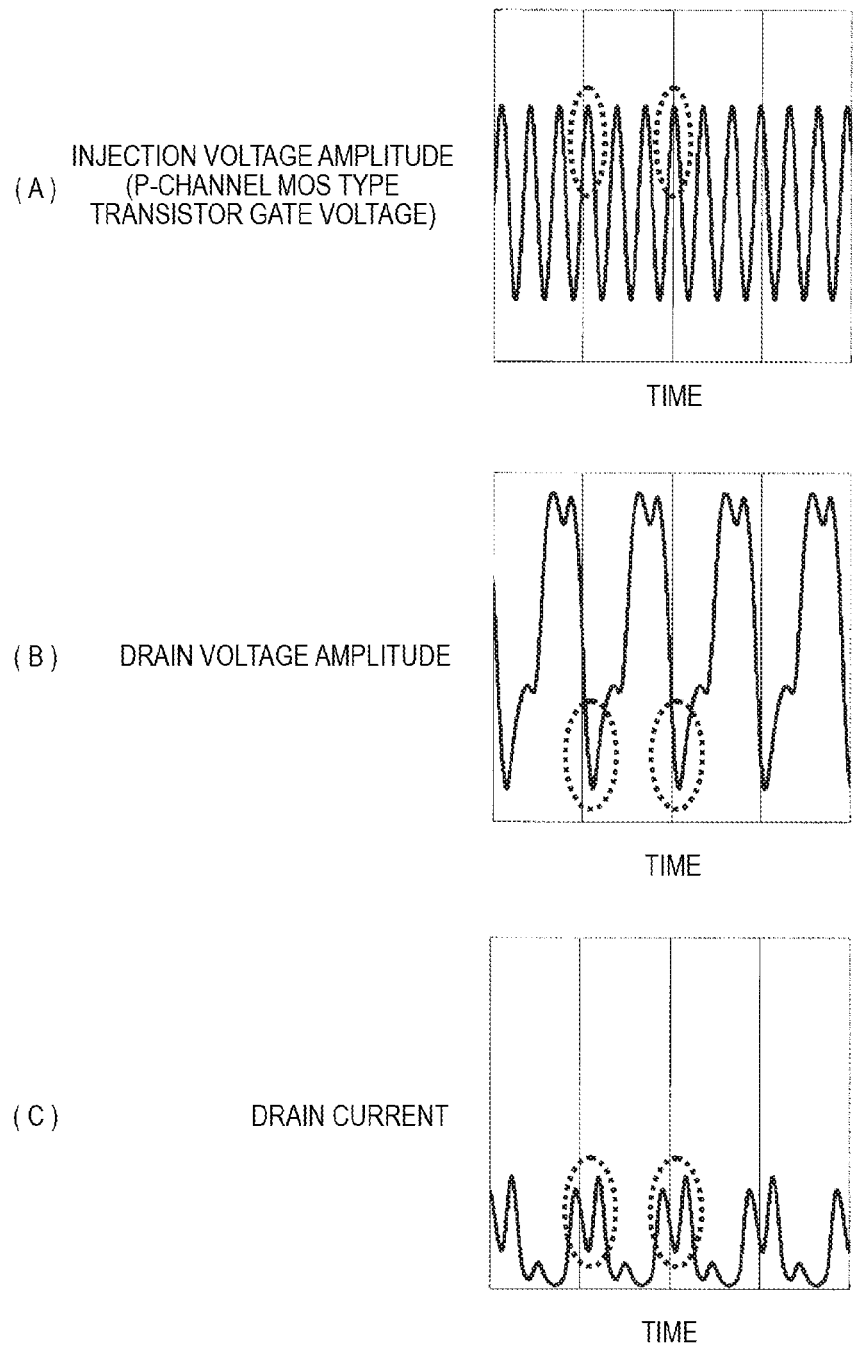
FIGS. 15(A), 15(B), 15(C) are graphs showing time characteristics respectively when the voltage amplitude of an injection signal is large.

FIG. 13 is a graph showing the relationship between the voltage amplitude of an injection signal and an operation frequency in the injection locked frequency divider 10 according to the background art. The injection locked frequency divider 10 operates as a divider within a range enclosed by a curve (solid line) shown in FIG. 13, but does not serve as a divider out of the range enclosed by the curve (solid line) shown in FIG. 13.

In FIG. 13, the voltage amplitude of an injection signal is the smallest near the frequency which is three times as high as the free running frequency $f_0$ of the injection locked frequency divider 10. When an injection signal whose frequency is three times as high as the free running frequency $f_0$ of the injection signal is input to the injection locked frequency divider 10, the voltage amplitude of the injection signal can be minimized so that power consumption can be reduced. In addition, in FIG. 13, the voltage amplitude of the injection signal not lower than $V_0$ is required for operating the injection locked frequency divider 10 as a divider.

However, there is a problem in the injection locked frequency divider 10 according to the background art shown in FIG. 11, as follows.

In FIG. 13, when the voltage amplitude of the injection signal is too large, the injection locked frequency divider 10 cannot be synchronized near the frequency which is three times as high as the free running frequency $f_0$ of the injection locked frequency divider 10. When the voltage amplitude of the injection signal is beyond $V_1$, the injection locked frequency divider 10 cannot operate as a divider.

FIGS. 14(A), 14(B), 14(C) are graphs showing time characteristics respectively when the voltage amplitude of an injection signal is small. FIG. 14(A) is a graph showing the time characteristic of the gate voltage amplitude of a P-channel MOS type transistor. FIG. 14(B) is a graph showing the time characteristic of the drain voltage amplitude of the P-channel MOS type transistor. FIG. 14(C) shows the time characteristic of the drain current of the P-channel MOS type transistor.

FIGS. 15(A), 15(B), 15(C) are graphs showing time characteristics respectively when the voltage amplitude of an injection signal is large. FIG. 15(A) is a graph showing the time characteristic of the gate voltage amplitude of a P-channel MOS type transistor. FIG. 15(B) is a graph showing the time characteristic of the drain voltage amplitude of the P-channel MOS type transistor. FIG. 15(C) shows the time characteristic of the drain current of the P-channel MOS type transistor.

In FIGS. 14(A) to 14(C), when the voltage amplitude of the injection signal is small, the drain voltage amplitude waveform and the drain current waveform become sine waveforms with less distortion. The drain voltage amplitude shown in FIG. 14(B) shows the waveform of the output signal oscillated by the injection locked frequency divider 10 shown in FIG. 11. In FIG. 14(B), the injection locked frequency divider 10 oscillates synchronously at a frequency which is equivalent to ⅓ of the frequency of the voltage amplitude of the injection signal. That is, the injection locked frequency divider 10 operates as a divider dividing the frequency of the injection signal into ⅓, and outputs an output signal whose frequency is equivalent to ⅓ of the frequency of the injection signal.

On the other hand, in FIGS. 15(A) to 15(C), when the voltage amplitude of the injection signal is large, distortion occurs in the drain voltage amplitude waveform and the drain current waveform (see the broken lines in FIGS. 15(A) to 15(C)). This is because the voltage amplitude input to the gate terminal of the P-channel MOS type transistor is so large that the voltage difference between the source terminal and the gate terminal of the P-channel MOS type transistor becomes lower than the threshold voltage of the P-channel MOS type transistor, with the result that the P-channel MOS type transistor turns off.

When the voltage difference between the source terminal and the gate terminal of the P-channel MOS type transistor becomes lower than the threshold voltage of the P-channel MOS type transistor, no current flows into the P-channel MOS type transistor. Thus, a distortion component of the frequency of the injection signal appears in the drain voltage amplitude shown in FIG. 15(B) and the drain current shown in FIG. 15(C).

In addition, when the voltage amplitude of the injection signal further increases, the distortion component becomes larger than the magnitude of the output signal waveform of the injection locked frequency divider 10 shown in FIG. 11. Thus, the injection signal is output without being divided. That is, when the voltage amplitude of the injection signal is larger than a predetermined value, there arises a problem that synchronization at the frequency which is equal to ⅓ of the frequency of the injection signal becomes difficult in the injection locked frequency divider 10 shown in FIG. 11 but the injection locked frequency divider 10 cannot operate as a divider.

Therefore, each of the following embodiments will be described along an example of an injection locked oscillator which operates stably as an oscillator and widen the bandwidth of an operation frequency even if the amplitude of an injection signal is larger than a predetermined value.

Each embodiment of an injection locked oscillator according to the present disclosure will be described with reference to the drawings. Although each embodiment is described using an injection locked frequency divider as an example of an injection locked oscillator according to the present disclosure, the description will be made using an injection locked frequency multiplier as necessary.

(First Embodiment)

Figure 1:
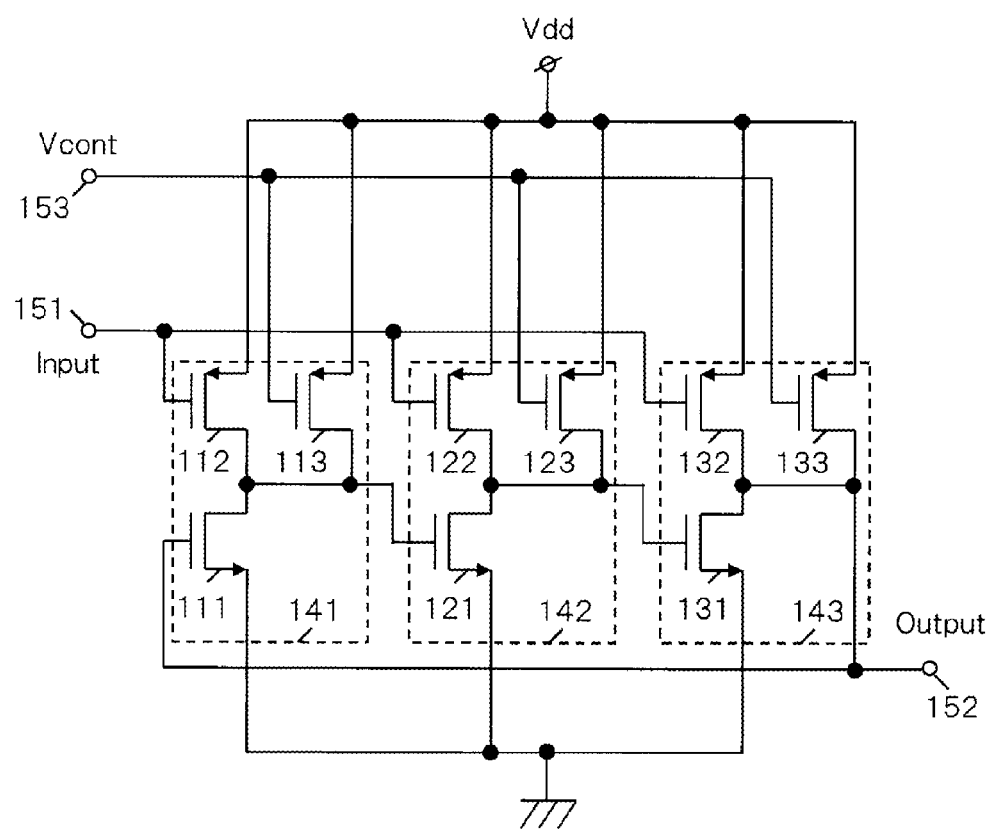
FIG. 1 is a diagram showing the circuit configuration of an injection locked frequency divider according to a first embodiment.

FIG. 1 is a diagram showing the circuit configuration of an injection locked frequency divider 100 according to a first embodiment. The injection locked frequency divider 100 shown in FIG. 1 includes a ring oscillator, an input terminal 151, an output terminal 152 and a control voltage terminal 153. In the ring oscillator, a three-stage cascade connection of a first amplification circuit 141, a second amplification circuit 142 and a third amplification circuit 143 is formed on a loop.

The first amplification circuit 141 includes an N-channel MOS type transistor 111 whose gate terminal receives a feedback output of the third amplification circuit 143, and P-channel MOS type transistors 112 and 113 each serving as a load.

The second amplification circuit 142 includes an N-channel MOS type transistor 121 whose gate terminal receives an output of the first amplification circuit 141, and P-channel MOS type transistors 122 and 123 each serving as a load.

The third amplification circuit 143 includes an N-channel MOS type transistor 131 whose gate terminal receives an output of the second amplification circuit 142, and P-channel MOS type transistors 132 and 133 each serving as a load.

Gate terminals of the P-channel MOS type transistors 112, 122 and 132 are connected to the input terminal 151 to which an injection signal (high frequency signal) is input. Gates of the P-channel MOS type transistors 113, 123 and 133 are connected to the control voltage terminal 153 to which a DC gate bias voltage is input. In addition, source terminals of the P-channel MOS type transistors 112, 113, 122, 123, 132 and 133 are connected to a high potential power source Vdd. Source terminals of the N-channel MOS type transistors 111, 121 and 131 are grounded.

A high frequency signal (injection signal, for example, 10 [GHz]) to be input to the injection locked frequency divider 100 is input to the input terminal 151.

An output signal of the injection locked frequency divider 100, that is, a frequency division signal divided by the injection locked frequency divider 100 or a free running signal oscillated by the injection locked frequency divider 100 is output from the output terminal 152.

A DC gate bias voltage Vcont output by a gate bias generating circuit (not shown) which does not belong to the injection locked frequency divider 100 is input to the control voltage terminal 153.

The operation of the injection locked frequency divider 100 according to the embodiment will be described.

Figure 9:
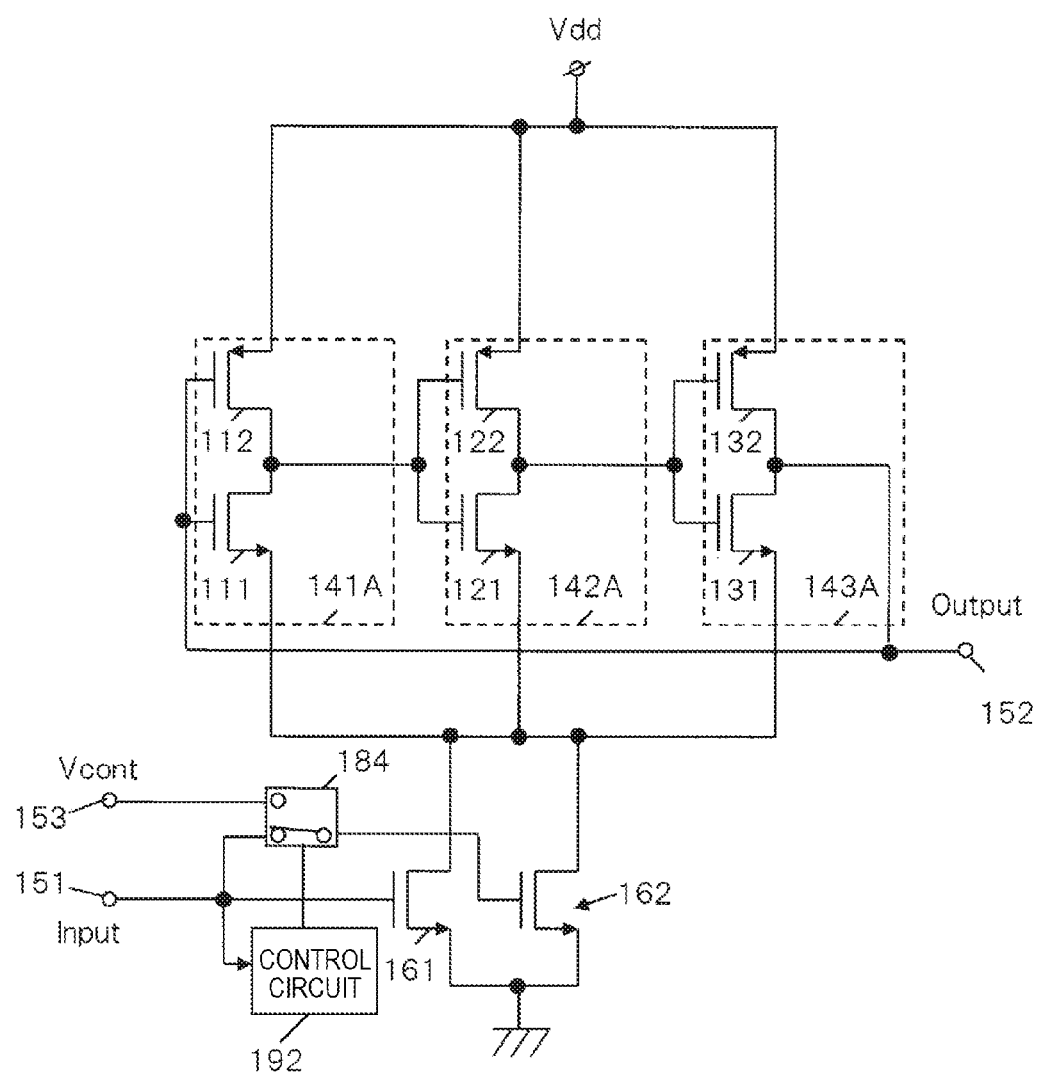
FIG. 9 is a diagram showing the circuit configuration of an injection locked frequency divider according to a fifth embodiment.

When there is no injection signal input to the input terminal 151, a free running signal F1 of a free running frequency $f_0$, a secondary harmonic component F2 of a frequency $2f_0$ and a tertiary harmonic component F3 of a frequency $3f_0$ appear in the output terminal 152 of the ring oscillator, that is, in the output terminal 152 of the injection locked frequency divider 100 (see FIG. 9).

Next, when an injection signal I1 near the frequency $3f_0$ is input to the input terminal 151, an output signal I2 in which the injection signal I1 has been down-converted appears near the free running frequency $f_0$ due to mixing of the injection signal I1 and the secondary harmonic component F2. Thus, the free running signal F1 of the injection locked frequency divider 100 is attracted toward the frequency of the output signal I2 and synchronized.

Therefore, when the injection signal I1 near the frequency $3f_0$ is input to the input terminal 151, the injection locked frequency divider 100 outputs the output signal I2 near the free running frequency f0 to the output terminal 152 and operates as a divider which multiplies the frequency by three (that is, divides the frequency into ⅓).

In the embodiment, the injection signal input to the input terminal 151 is supplied to the gate terminal of each P-channel MOS type transistor 112, 122, 132 serving as a part of the load. When the voltage amplitude of the injection signal is larger than the predetermined value, the P-channel MOS type transistor 112, 122, 132 turns off so that a drain current cannot flow therein.

In the embodiment, however, the predetermined DC gate bias voltage Vcont is supplied to the gate terminal of each P-channel MOS type transistor 113, 123, 133 serving as a part of the load, to which the injection signal is not input. Therefore, a drain current flows into the P-channel MOS type transistor 113, 123, 133. That is, in the injection locked frequency divider 100, each P-channel MOS type transistor 113, 123, 133 operates as a current source.

As a result, the injection locked frequency divider 100 can reduce the distortion component appearing in the drain voltage amplitude and the drain current in each amplification circuit 141, 142, 143 even when the voltage amplitude of the injection signal input to the input terminal 151 is larger than the predetermined value.

Figure 2:
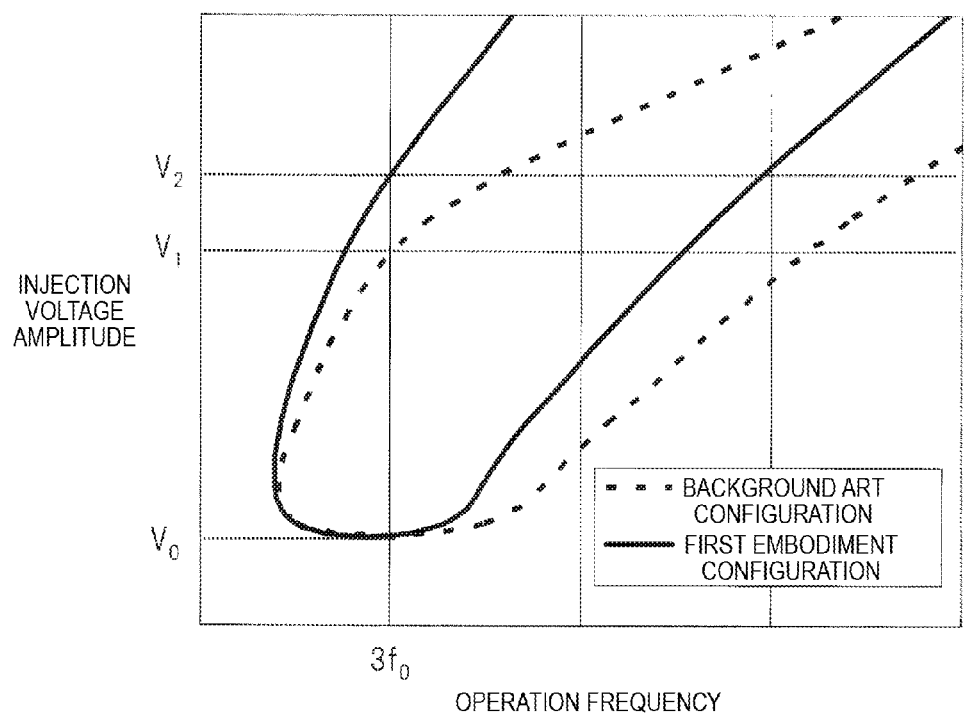
FIG. 2 is a graph showing the relationship between the voltage amplitude of an injection signal and an operation frequency in an injection locked frequency divider according to the background art and the injection locked frequency divider according to the first embodiment.

FIG. 2 is a graph showing the relationship between the voltage amplitude of an injection signal and an operation frequency in an injection locked frequency divider according to the background art and the injection locked frequency divider according to the first embodiment. The injection locked frequency divider 100 operates as a divider within a range enclosed by the curve (solid line) shown in FIG. 2, but does not operate as a divider out of the range enclosed by the curve (solid line) shown in FIG. 2.

In FIG. 2, the voltage amplitude of an injection signal is the smallest near the frequency which is three times as high as the free running frequency $f_0$ of the injection locked frequency divider 100. When an injection signal whose frequency is three times as high as the free running frequency $f_0$ of the injection signal is input to the injection locked frequency divider 100, the voltage amplitude of the injection signal can be minimized so that the power consumption can be reduced. In addition, in FIG. 2, a voltage of at least $V_0$ is required as the voltage amplitude of the injection signal in order to operate the injection locked frequency divider 100 as a divider.

In FIG. 2, the background art injection locked frequency divider (for example, the injection locked frequency divider 10 shown in FIG. 11) does not operate as a divider when the voltage amplitude of an injection signal exceeds $V_1$, but the injection locked frequency divider 100 can operate as a divider even when the voltage amplitude of an injection signal exceeds $V_1$.

This is because a DC gate bias voltage is supplied to the gate terminal of each P-channel MOS type transistor 113, 123, 133 in the injection locked frequency divider 100 so that each P-channel MOS type transistor 113, 123, 133 operates as a current source to prevent the drain voltage amplitude and the drain current in each amplification circuit 141, 142, 143 from being distorted, with the result that the injection signal is divided correctly in the injection locked frequency divider 100.

On the other hand, the injection locked frequency divider 100 does not operate as a divider when the voltage amplitude of an injection signal exceeds $V_2$. As compared with the background art injection locked frequency divider (for example, the injection locked frequency divider 10 shown in FIG. 11), however, the injection locked frequency divider 100 can operate as a divider even when the voltage amplitude of the injection signal is large.

From above, the injection locked frequency divider 100 according to the embodiment includes a ring oscillator having a three-stage cascade connection in which the first amplification circuit 141, the second amplification circuit 142 and the third amplification circuit 143 are connected on a loop. In the ring oscillator, an injection signal (high frequency signal) is input to the gate terminals of the P-channel MOS type transistors 112, 122 and 132 of the amplification circuits 141 to 143, and further a DC gate bias voltage Vcont is supplied to the gate terminals of the P-channel MOS type transistors 113, 123 and 133 of the amplification circuits 141 to 143.

Thus, in the injection locked frequency divider 100, a high frequency signal is input to each P-channel MOS type transistor 112, 122, 132, while each P-channel MOS type transistor 113, 123, 133 to which the high frequency signal is not input is operated as a current source. Accordingly, even when the voltage amplitude of the injection signal is larger than a predetermined value, a drain current flows so that the bandwidth of an operation frequency as a divider can be widened. For example, the injection locked frequency divider 100 shown in FIG. 1 can operate in a wide band as a divider which divides the frequency of an injection signal into ⅓ even when the voltage amplitude of the injection signal is large.

In addition, the injection locked frequency divider 100 according to the embodiment has a simple circuit configuration, by which the circuit scale can be prevented from increasing and the number of parts can be reduced as compared with the background art injection locked frequency divider (for example, the injection locked frequency divider 10 shown in FIG. 11).

Although the embodiment has been described on the assumption that the number of stages of amplification circuits constituting a ring oscillator is three, the number of stages is not limited to three. For example, the number of stages of amplification circuits constituting a ring oscillator may be set at (2n+1) (n is an integer of 1 or more). In the injection locked frequency divider 100, the frequency of an injection signal input to the input terminal 151 may be set near a frequency which is about m(2n+1) times as high as the free running frequency $f_0$ of the ring oscillator.

For example, when the number of stages of amplification circuits constituting a ring oscillator is five, a signal whose frequency is 5 or 10 times as high as the free running frequency of the ring oscillator is injected in the injection locked frequency divider 100. As a result, the injection locked frequency divider 100 can obtain a similar effect to that in the aforementioned three-stage configuration.

In addition, although the embodiment has been described as to an injection locked frequency divider, a similar effect can be obtained, for example, in the case of an injection locked frequency multiplier which is synchronized with a harmonic component of an injection signal. The injection locked frequency multiplier has a similar circuit configuration to that of the injection locked frequency divider 100 shown in FIG. 1. Therefore, the same reference numerals and signs will be used in the following description, in which the same contents will be omitted or simplified while different contents will be explained.

Figure 3:
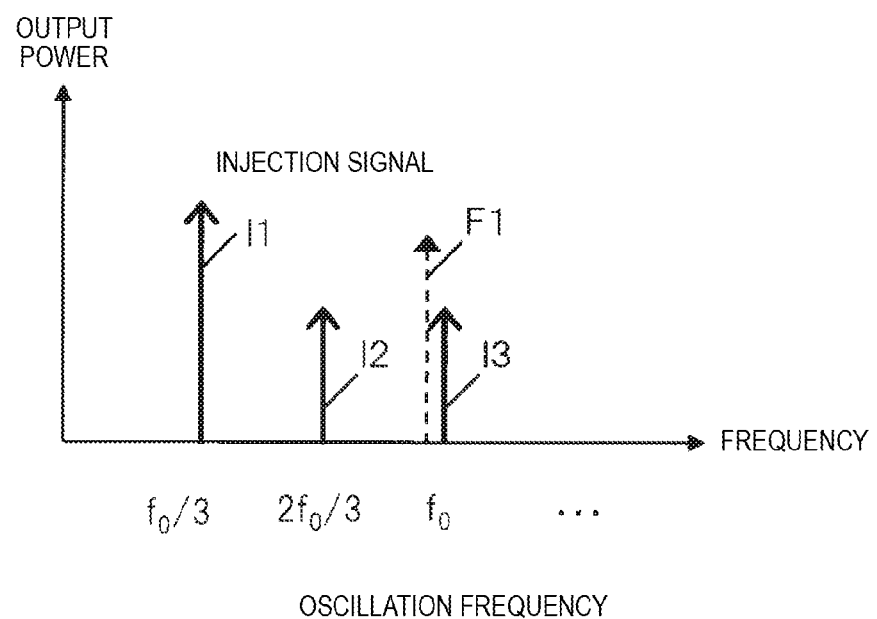
FIG. 3 is a graph showing the relationship between the frequency and the electric power of an output signal of an injection locked frequency multiplier.

FIG. 3 is a graph showing the relationship between the frequency and the electric power of an output signal of an injection locked frequency multiplier 100X.

In FIG. 3, when there is no injection signal input to the input terminal 151, a free running signal F1 of a free running frequency $f_0$ appears in the output terminal 152 of the ring oscillator, that is, in the output terminal 152 of the injection locked frequency multiplier 100X.

Next, when an injection signal I1 near a frequency $f_0/3$ is input to the input terminal 151, a secondary harmonic component I2 of a frequency $2f_0/3$ and a tertiary harmonic component I3 of the frequency $f_0$ appear. Thus, the free running signal F1 of the ring oscillator, that is, the free running signal F1 of the injection locked frequency multiplier 100X is attracted toward the frequency of the tertiary harmonic component I3 of the injection signal I1 and synchronized. That is, the injection locked frequency multiplier 100X outputs the output signal I3 of the frequency $f_0$ in response to the injection signal I1 of the frequency $f_0/3$, and operates as a 3-multiplier which multiplies the frequency by three.

The number of stages of amplification circuits constituting the ring oscillator in the injection locked frequency multiplier 100X may be set at (2n+1), and the frequency of an injection signal input to the input terminal 151 may be set near a frequency which is about 1/(m(2n+1)) (m is an integer of 1 or more) times as high as the free running frequency $f_0$ of the ring oscillator. Thus, the injection locked frequency multiplier 100X can operate as an injection locked frequency multiplier which multiplies the frequency of an injection signal by m(2n+1).

The injection locked oscillator according to the present disclosure operates as an injection locked frequency divider when the injection locked oscillator is synchronized with an injection signal whose frequency is higher than the free running frequency $f_0$, and operates as an injection locked frequency multiplier when the injection locked oscillator is synchronized with an injection signal whose frequency is lower than the free running frequency $f_0$.

In addition, although the embodiment has been described as to the circuit configuration in which an injection signal (high frequency signal) is input to the P-channel MOS type transistor of each amplification circuit, a similar effect is obtained even if the P-channel MOS type transistors are replaced by the N-channel MOS type transistors. The same thing is applied to the following embodiments.

(Second Embodiment)

Figure 4:
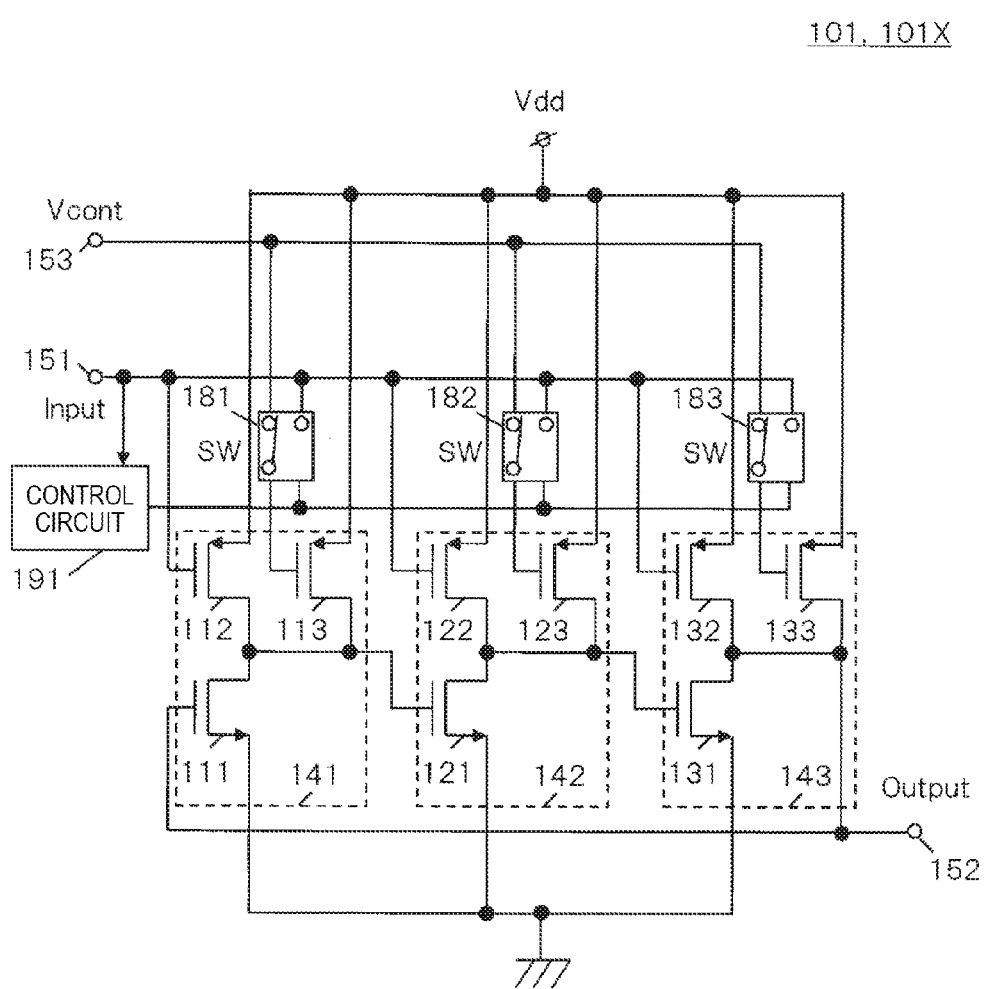
FIG. 4 is a diagram showing the circuit configuration of an injection locked frequency divider according to a second embodiment.

FIG. 4 is a diagram showing the circuit configuration of an injection locked frequency divider 101 according to a second embodiment. The same circuit constituents as those of the injection locked frequency divider 100 shown in FIG. 1 are referenced correspondingly in the injection locked frequency divider 101 shown in FIG. 4, and the same contents thereof will be omitted or simplified while different contents will be explained.

The injection locked frequency divider 101 shown in FIG. 4 includes a ring oscillator, an input terminal 151, an output terminal 152, a control voltage terminal 153, switches 181 to 183 and a control circuit 191. In the ring oscillator, a three-stage cascade connection of a first amplification circuit 141, a second amplification circuit 142 and a third amplification circuit 143 is formed on a loop. Incidentally, the control circuit 191 does not have to be included in the configuration of the injection locked frequency divider 101.

The switch 181 switches an output between an injection signal (high frequency signal) input to the input terminal 151 and a DC gate bias voltage input to the control voltage terminal 153 in accordance with a control signal output by the control circuit 191, and supplies the output to the gate terminal of the P-channel MOS type transistor 113.

The switch 182 switches an output between the injection signal (high frequency signal) input to the input terminal 151 and the DC gate bias voltage input to the control voltage terminal 153 in accordance with the control signal output by the control circuit 191, and supplies the output to the gate terminal of the P-channel MOS type transistor 123.

The switch 183 switches an output between the injection signal (high frequency signal) input to the input terminal 151 and the DC gate bias voltage input to the control voltage terminal 153 in accordance with the control signal output by the control circuit 191, and supplies the output to the gate terminal of the P-channel MOS type transistor 133.

The control circuit 191 generates a control signal for inputting the injection signal or the DC gate bias voltage to the gate terminals of the P-channel MOS type transistors 113, 123 and 133 of the amplification circuits 141 to 143 in accordance with the voltage amplitude of the injection signal (high frequency signal) input to the input terminal 151, and supplies the generated control signal to the switches 181 to 183.

Specifically, when the voltage amplitude of the injection signal is larger than a predetermined value $V_{SW}$, the control circuit 191 generates a control signal for inputting the DC gate bias voltage to the gate terminals of the P-channel MOS type transistors 113, 123 and 133 of the amplification circuits 141 to 143, and supplies the generated control signal to the switches 181 to 183. The value $V_{SW}$ is a threshold value predetermined in the injection locked frequency divider 101.

On the other hand, when the voltage amplitude of the injection signal is not larger than the predetermined value $V_{SW}$, the control circuit 191 generates a control signal for inputting the injection signal to the gate terminals of the P-channel MOS type transistors 113, 123 and 133 of the amplification circuits 141 to 143, and supplies the generated control signal to the switches 181 to 183.

Next, the operation of the injection locked frequency divider 101 according to the embodiment will be described.

When there is no injection signal input to the input terminal 151, a free running signal F1 of a free running frequency $f_0$, a secondary harmonic component F2 of a frequency $2f_0$ and a tertiary harmonic component F3 of a frequency $3f_0$ appear in the output terminal 152 of the ring oscillator, that is, in the output terminal 152 of the injection locked frequency divider 101 (see FIG. 9).

Next, when an injection signal I1 near the frequency $3f_0$ is input to the input terminal 151, an output signal I2 in which the injection signal I1 has been down-converted appears near the free running frequency $f_0$ due to mixing of the injection signal I1 and the secondary harmonic component F2. Thus, the free running signal F1 of the injection locked frequency divider 101 is attracted toward the frequency of the output signal I2 and synchronized.

Therefore, when the injection signal I1 near the frequency $3f_0$ is input to the input terminal 151, the injection locked frequency divider 101 outputs the output signal I2 near the free running frequency $f_0$ to the output terminal 152, and operates as a divider which divides the frequency into ⅓.

In the embodiment, when the switches 181 to 183 supply the injection signal to the gate terminals of the P-channel MOS type transistors 113, 123 and 133 in accordance with the control signal generated by the control circuit 191, the circuit configuration of the injection locked frequency divider 101 is equivalent to the circuit configuration of the background art injection locked frequency divider (for example, the injection locked frequency divider 10 shown in FIG. 11).

On the other hand, when the switches 181 to 183 supply the DC gate bias voltage to the gate terminals of the P-channel MOS type transistors 113, 123 and 133 in accordance with the control signal generated by the control circuit 191, the circuit configuration of the injection locked frequency divider 101 is equivalent to the circuit configuration of the injection locked frequency divider 100 according to the first embodiment. In the second embodiment, the injection locked frequency divider 101 can be changed over between the background art injection locked frequency divider (for example, the injection locked frequency divider 10 shown in FIG. 11) and the injection locked frequency divider 100 according to the first embodiment in accordance with the control signal generated by the control circuit 191.

Figure 5:
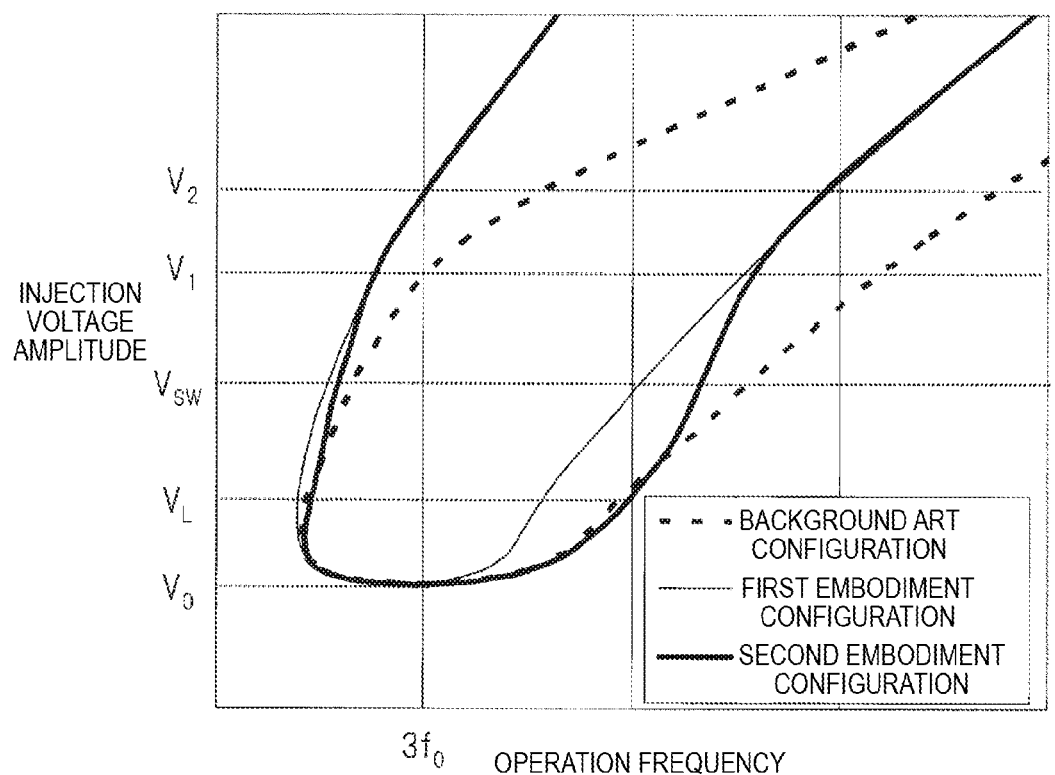
FIG. 5 is a graph showing the relationship between the voltage amplitude of an injection signal and an operation frequency in the injection locked frequency divider according to the background art, the injection locked frequency divider according to the first embodiment and the injection locked frequency divider according to the second embodiment.

FIG. 5 is a graph showing the relationship between the voltage amplitude of an injection signal and an operation frequency in the injection locked frequency divider according to the background art, the injection locked frequency divider 100 according to the first embodiment and the injection locked frequency divider 101 according to the second embodiment. The injection locked frequency divider 101 operates as a divider within a range enclosed by the curve (thick solid line) shown in FIG. 5, but does not operate as a divider out of the range enclosed by the curve (thick solid line) shown in FIG. 5.

In FIG. 5, the voltage amplitude of an injection signal is the smallest near the frequency which is three times as high as the free running frequency $f_0$ of the injection locked frequency divider 101. When an injection signal whose frequency is three times as high as the free running frequency $f_0$ of the injection signal is input to the injection locked frequency divider 101, the voltage amplitude of the injection signal can be minimized so that the power consumption can be reduced. In addition, in FIG. 5, a voltage of at least $V_0$ is required as the voltage amplitude of the injection signal in order to operate the injection locked frequency divider 101 as a divider.

In FIG. 5, when the voltage amplitude of an injection signal exceeds the predetermined value $V_{SW}$, the injection locked frequency divider 101 according to the embodiment obtains a similar circuit configuration to that of the injection locked frequency divider 100 according to the first embodiment due to switching in the switches 181 to 183. As a result, in the injection locked frequency divider 101, the maximum value of the voltage amplitude of the injection signal increases from $V_1$ to $V_2$ in the same manner as in the injection locked frequency divider 100 according to the first embodiment, as compared with the background art injection locked frequency divider (for example, the injection locked frequency divider 10 shown in FIG. 11). Thus, the injection locked frequency divider 101 can operate as a divider even when the voltage amplitude of the injection signal is large.

On the other hand, when the voltage amplitude of an injection signal is smaller than the predetermined value $V_{SW}$, the injection locked frequency divider 101 according to the embodiment obtains a similar circuit configuration to that of the background art injection locked frequency divider (for example, the injection locked frequency divider 10 shown in FIG. 11) due to switching in the switches 181 to 183. As a result, in the injection locked frequency divider 101, reduction in operation frequency bandwidth as a divider can be suppressed at $V_L$ in which the voltage amplitude of the injection signal is smaller than the predetermined value $V_{SW}$.

From above, the injection locked frequency divider 101 according to the embodiment further includes the switches 181 to 183 and the control circuit 191 in addition to the circuit configuration of the injection locked frequency divider 100 according to the first embodiment. Due to switching in the switches 181 to 183 in accordance with the magnitude of the voltage amplitude of the injection signal input to the input terminal 151, the injection locked frequency divider 101 obtains a similar circuit configuration to that of the injection locked frequency divider 100 according to the first embodiment when the voltage amplitude of the injection signal is larger than the predetermined value $V_{SW}$, and obtains a similar circuit configuration to that of the background art injection locked frequency divider (for example, the injection locked requency divider 10 shown in FIG. 11) when the voltage amplitude of the injection signal is not larger than the predetermined value $V_{SW}$.

As a result, in the injection locked frequency divider 101, the maximum value of the voltage amplitude of the injection signal can be increased from $V_1$ to $V_2$ when the voltage amplitude of the injection signal is larger than the predetermined value $V_{SW}$. Thus, the injection locked frequency divider 101 can operate as a divider even when the voltage amplitude of the injection signal is large. On the other hand, when the voltage amplitude of the injection signal is not larger than the predetermined value $V_{SW}$, the injection locked frequency divider 101 can suppress reduction in operation frequency bandwidth as a divider. Accordingly, the injection locked frequency divider 101 according to the embodiment can widen the operation frequency bandwidth as a divider as compared with the injection locked frequency divider 100 according to the first embodiment.

Although the embodiment has been described on the assumption that the number of stages of amplification circuits constituting a ring oscillator is three, the number of stages is not limited to three. For example, the number of stages of amplification circuits constituting a ring oscillator may be set at (2n+1). In the injection locked frequency divider 101, the frequency of an injection signal input to the input terminal 151 may be set near a frequency which is about m(2n+1) times as high as the free running frequency $f_0$ of the ring oscillator.

For example, when the number of stages of amplification circuits constituting a ring oscillator is five, a signal whose frequency is 5 or 10 times as high as the free running frequency of the ring oscillator is injected in the injection locked frequency divider 101. As a result, the injection locked frequency divider 101 can obtain a similar effect to that in the aforementioned three-stage configuration.

In addition, although the embodiment has been described as to an injection locked frequency divider, a similar effect is obtained, for example, in the case of an injection locked frequency multiplier which is synchronized with a harmonic component of an injection signal. The injection locked frequency multiplier has a similar circuit configuration to that of the injection locked frequency divider 101 shown in FIG. 4. For example, the number of stages of amplification circuits constituting a ring oscillator may be set at (2n+1), and the frequency of an injection signal input to the input terminal 151 may be set near a frequency which is about 1/(m(2n+1)) times as high as the free running frequency $f_0$ of the ring oscillator. Thus, the injection locked frequency multiplier 101X can operate as a multiplier which multiplies the frequency by m(2n+1).

The injection locked oscillator according to the present disclosure operates as an injection locked frequency divider when the injection locked oscillator is synchronized with an injection signal whose frequency is higher than the free running frequency $f_0$, and operates as an injection locked frequency multiplier when the injection locked oscillator is synchronized with an injection signal whose frequency is lower than the free running frequency $f_0$.

(Third Embodiment)

Figure 6:
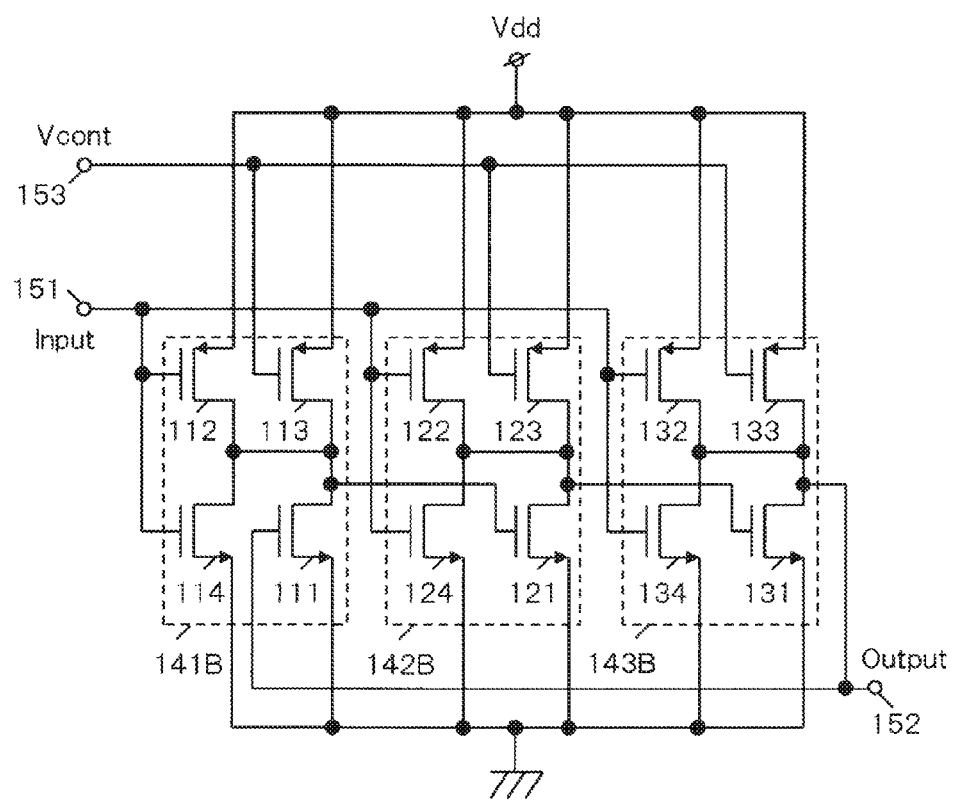
FIG. 6 is a diagram showing the circuit configuration of an injection locked frequency divider according to a third embodiment.

FIG. 6 is a diagram showing the circuit configuration of an injection locked frequency divider 104 according to a third embodiment. The same circuit constituents as those of the injection locked frequency divider 100 shown in FIG. 1 are referenced correspondingly in the injection locked frequency divider 104 shown in FIG. 6, and the same contents thereof will be omitted or simplified while different contents will be explained.

The injection locked frequency divider 104 shown in FIG. 6 includes a ring oscillator, an input terminal 151, an output terminal 152 and a control voltage terminal 153. In the ring oscillator, a three-stage cascade connection of a first amplification circuit 141B, a second amplification circuit 142B and a third amplification circuit 143B is formed on a loop.

The first amplification circuit 141B includes an N-channel MOS type transistor 111 whose gate terminal receives a feedback output of the third amplification circuit 143B, a P-channel MOS type transistor 113 which serves as a load, and a P-channel MOS type transistor 112 and an N-channel MOS type transistor 114 which serve as an amplifier.

The second amplification circuit 142B includes an N-channel MOS type transistor 121 whose gate terminal receives an output of the first amplification circuit 141B, a P-channel MOS type transistor 123 which serves as a load, and a P-channel MOS type transistor 122 and an N-channel MOS type transistor 124 which serve as an amplifier.

The third amplification circuit 143B includes an N-channel MOS type transistor 131 whose gate terminal receives an output of the second amplification circuit 142B, a P-channel MOS type transistor 133 which serves as a load, and a P-channel MOS type transistor 132 and an N-channel MOS type transistor 134 which serve as an amplifier.

Gate terminals and drain terminals of the N-channel MOS type transistors 114, 124 and 134 are connected to gate terminals and drain terminals of the P-channel MOS type transistors 112, 122 and 132 respectively. In addition, source terminals of the N-channel MOS type transistors 114, 124 and 134 are grounded.

Next, the operation of the injection locked frequency divider 104 according to the embodiment will be described.

When there is no injection signal input to the input terminal 151, a free running signal F1 of a free running frequency $f_0$, a secondary harmonic component F2 of a frequency $2f_0$ and a tertiary harmonic component F3 of a frequency $3f_0$ appear in the output terminal 152 of the ring oscillator, that is, in the output terminal 152 of the injection locked frequency divider 104 (see FIG. 12).

Next, when an injection signal I1 near the frequency $3f_0$ is input to the input terminal 151, an output signal I2 in which the injection signal I1 has been down-converted appears near the free running frequency $f_0$ due to mixing of the injection signal I1 and the secondary harmonic component F2. Thus, the free running signal F1 of the injection locked frequency divider 104 is attracted toward the frequency of the output signal I2 and synchronized.

Therefore, when the injection signal I1 near the frequency $3f_0$ is input to the input terminal 151, the injection locked frequency divider 104 outputs the output signal I2 near the free running frequency f0 to the output terminal 152, and operates as a divider which divides the frequency into 1/3.

In the embodiment, the input signal is amplified and injected because the N-channel MOS type transistors 114, 124 and 134 connected to the input terminal and the P-channel MOS type transistors 112, 122 and 132 operate as an inverter amplifier. In addition, the injection signal is not supplied to the gate of each P-channel MOS type transistor 113, 123, 133 serving as a current source of the injection locked frequency divider 104. Therefore, a drain current flows so stably that a distortion component in the drain voltage amplitude and the drain current in each amplification circuit 141B, 142B, 143B can be reduced.

Figure 7:
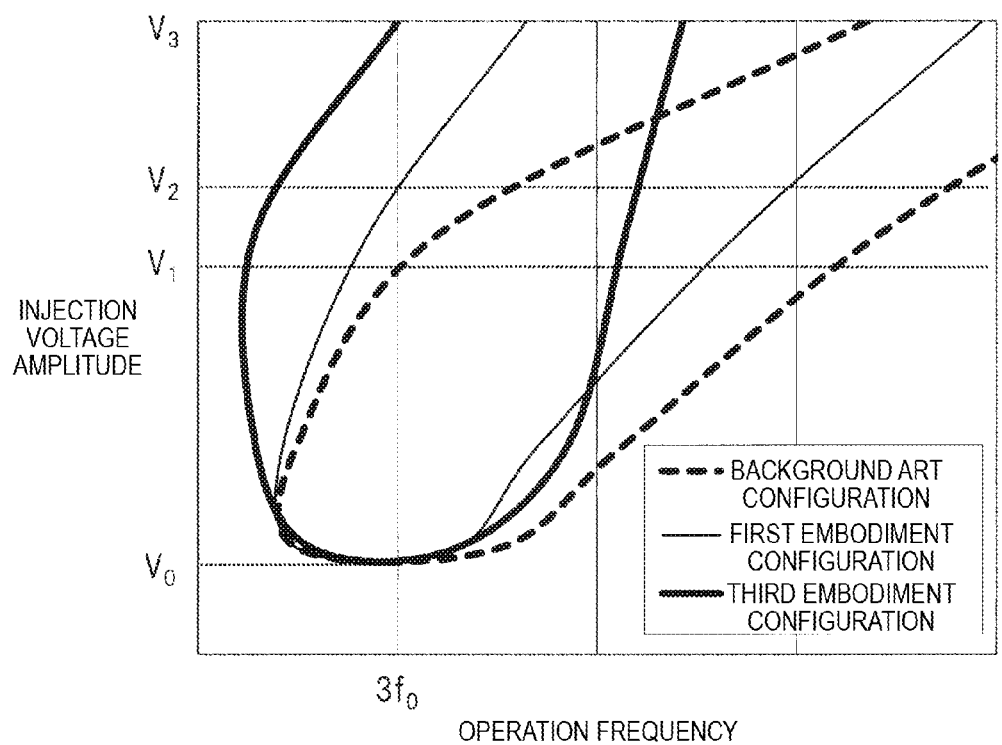
FIG. 7 is a graph showing the relationship between the voltage amplitude of an injection signal and an operation frequency in the injection locked frequency divider according to the background art, the injection locked frequency divider according to the first embodiment and the injection locked frequency divider according to the third embodiment.

FIG. 7 is a graph showing the relationship between the voltage amplitude of an injection signal and an operation frequency in the injection locked frequency divider according to the background art, the injection locked frequency divider 100 according to the first embodiment and the injection locked frequency divider 104 according to the third embodiment. The injection locked frequency divider 104 operates as a divider within a range enclosed by the curve (thick solid line) shown in FIG. 7, but does not operate as a divider out of the range enclosed by the curve (thick solid line) shown in FIG. 7.

In FIG. 7, the voltage amplitude of an injection signal is the smallest near the frequency which is three times as high as the free running frequency $f_0$ of the injection locked frequency divider 104. When an injection signal whose frequency is three times as high as the free running frequency $f_0$ of the injection locked frequency divider 100 or 104, the voltage amplitude of the injection signal can be minimized so that the power consumption can be reduced. In addition, in FIG. 7, a voltage of at least $V_0$ is required as the voltage amplitude of the injection signal in order to operate the injection locked frequency divider 104 as a divider.

In FIG. 7, when the voltage amplitude of an injection signal exceeds $V_1$ in the background art injection locked frequency divider (for example, the injection locked frequency divider 10 shown in FIG. 11) or when the voltage amplitude of an injection signal exceeds $V_2$ in the injection locked frequency divider 100 according to the first embodiment, the background art injection locked frequency divider or the injection locked frequency divider 100 does not operate as a divider. However, the injection locked frequency divider 104 can operate as a divider even when voltage amplitude of an injection signal exceeds $V_2$.

This reason is as follows. In the injection locked frequency divider 104, the injection signal is not supplied to the gate of each P-channel MOS type transistor 113, 123, 133 operating as a current source. Accordingly, a drain current flows stably to prevent distortion of the drain voltage amplitude and the drain current in each amplification circuit 141B, 142B, 143B, so that the frequency of the injection signal is divided correctly in the injection locked frequency divider 104.

In addition, the injection locked frequency divider 104 does not operate as a divider when the voltage amplitude of the injection signal exceeds $V_3$. However, as compared with the background art injection locked frequency divider (for example, the injection locked frequency divider 10 shown in FIG. 11) or the injection locked frequency divider according to the first embodiment, the injection locked frequency divider 104 can operate as a divider even when the voltage amplitude of the injection signal is large.

From above, the injection locked frequency divider 104 according to the embodiment further includes the N-channel MOS type transistors 114, 124 and 134 in addition to the circuit configuration of the injection locked frequency divider 100 according to the first embodiment.

Thus, the input signal is amplified and injected in the injection locked frequency divider 104 because the N-channel MOS type transistors 114, 124 and 134 connected to the input terminal and the P-channel MOS type transistors 112, 122 and 132 operate as an inverter amplifier. In addition, the injection signal is not supplied to the gates of the P-channel MOS type transistors 113, 123 and 133 serving as current sources of the injection locked frequency divider 104. Therefore, drain currents flow so stably that the operation bandwidth as a divider can be widened, and the injection locked frequency divider 104 can operate in the widened bandwidth as a divider dividing the frequency of the injection signal into ⅓ even when the voltage amplitude of the injection signal is large.

Although the embodiment has been described on the assumption that the number of stages of amplification circuits constituting a ring oscillator is three, the number of stages is not limited to three. For example, the number of stages of amplification circuits constituting a ring oscillator may be set at (2n+1). In the injection locked frequency divider 104, the frequency of an injection signal input to the input terminal 151 may be set near a frequency which is about m(2n+1) times as high as the free running frequency $f_0$ of the ring oscillator.

For example, when the number of stages of amplification circuits constituting a ring oscillator is five, a signal whose frequency is 5 or 10 times as high as the free running frequency of the ring oscillator is injected in the injection locked frequency divider 104. As a result, the injection locked frequency divider 104 obtains a similar effect to that in the aforementioned three-stage configuration.

In addition, although the embodiment has been described as to an injection locked frequency divider, a similar effect can be obtained, for example, in the case of an injection locked frequency multiplier 104X which is synchronized with a harmonic component of an injection signal. The injection locked frequency multiplier 104X has a similar circuit configuration to that of the injection locked frequency divider 104 shown in FIG. 6. For example, the number of stages of amplification circuits constituting a ring oscillator may be set at (2n+1), and the frequency of an injection signal input to the input terminal 151 may be set near a frequency which is about 1/(m(2n+1)) times as high as the free running frequency $f_0$ of the ring oscillator. Thus, the injection locked frequency multiplier 104X can operate as a multiplier which multiplies the frequency by m(2n+1).

The injection locked oscillator according to the present disclosure operates as an injection locked frequency divider when the injection locked oscillator is synchronized with an injection signal whose frequency is higher than the free running frequency $f_0$, and operates as an injection locked frequency multiplier when the injection locked oscillator is synchronized with an injection signal whose frequency is lower than the free running frequency $f_0$.

(Fourth Embodiment)

Figure 8:
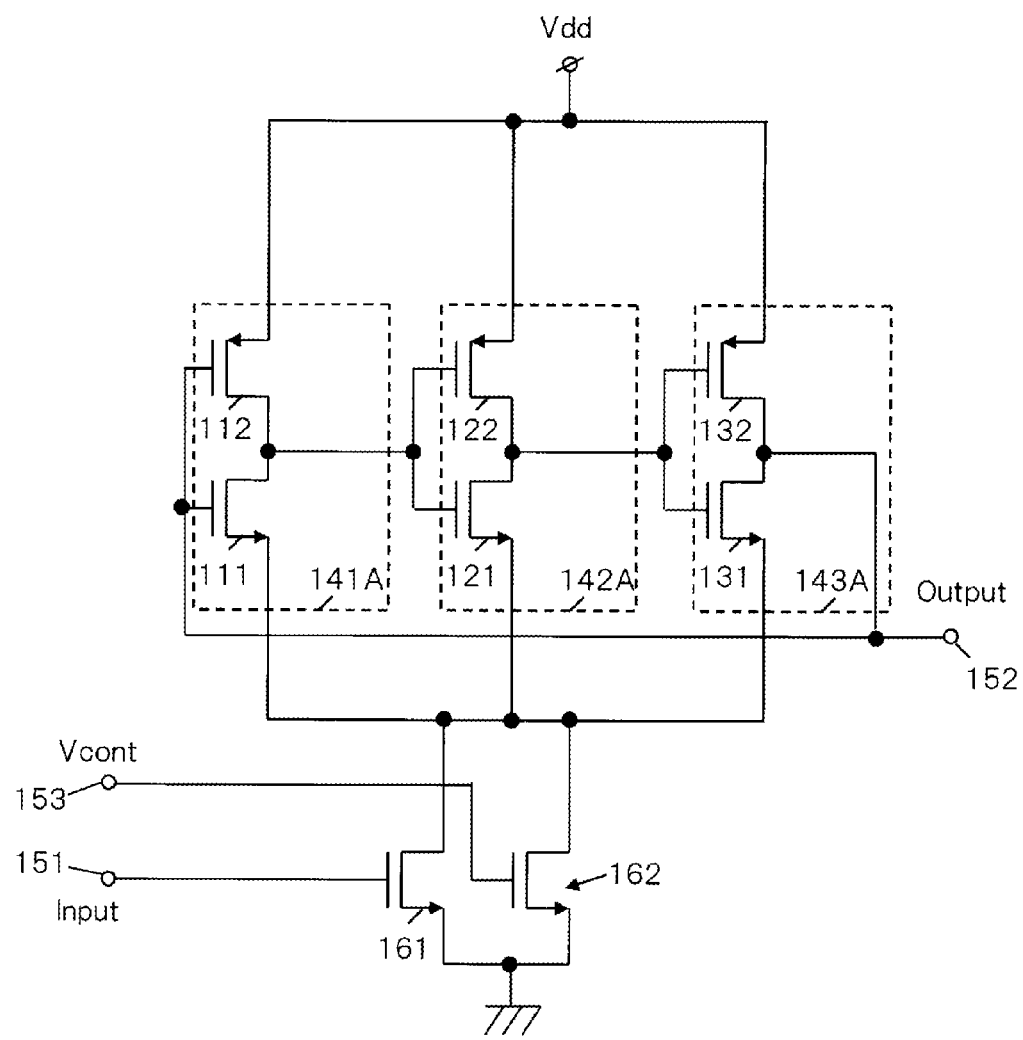
FIG. 8 is a diagram showing the circuit configuration of an injection locked frequency divider according to a fourth embodiment.

FIG. 8 is a diagram showing the circuit configuration of an injection locked frequency divider 102 according to a fourth embodiment. The injection locked frequency divider 102 shown in FIG. 8 includes a ring oscillator, an input terminal 151, an output terminal 152, a control voltage terminal 153, a first N-channel MOS type transistor 161 and a second N-channel MOS type transistor 162. In the ring oscillator, a three-stage cascade connection of a first amplification circuit 141A, a second amplification circuit 142A and a third amplification circuit 143A is formed on a loop.

The first amplification circuit 141A includes an N-channel MOS type transistor 111 whose gate terminal receives a feedback output of the third amplification circuit 143A, and a P-channel MOS type transistor 112 which serves as a load.

The second amplification circuit 142A includes an N-channel MOS type transistor 121 whose gate terminal receives an output of the first amplification circuit 141A, and a P-channel MOS type transistor 122 which serves as a load.

The third amplification circuit 143A includes an N-channel MOS type transistor 131 whose gate terminal receives an output of the second amplification circuit 142A, and a P-channel MOS type transistor 132 which serves as a load.

Source terminals of the N-channel MOS type transistors 111, 121 and 131 are connected to drain terminals of the first N-channel MOS type transistor 161 and the second N-channel MOS type transistor 162.

The input terminal 151 to which an injection signal (high frequency signal) is input is connected to a gate terminal of the first N-channel MOS type transistor 161, and the control voltage terminal 153 to which a DC gate bias voltage is input is connected to a gate terminal of the second N-channel MOS type transistor 162.

In addition, source terminals of the P-channel MOS type transistors 112, 122 and 132 are connected to a high potential power source Vdd, and source terminals of the first N-channel MOS type transistor 161 and the second N-channel MOS type transistor 162 are grounded.

A high frequency signal (injection signal, for example, 10 [GHz]) to be input to the injection locked frequency divider 102 is input to the input terminal 151.

An output signal of the injection locked frequency divider 102, that is, a frequency division signal divided by the injection locked frequency divider 102 or a free running signal oscillated by the injection locked frequency divider 102 is output from the output terminal 152.

A DC gate bias voltage Vcont output by a gate bias generating circuit (not shown) which does not belong to the injection locked frequency divider 102 is input to the control voltage terminal 153.

Next, the operation of the injection locked frequency divider 102 according to the embodiment will be described.

When there is no injection signal input to the input terminal 151, a free running signal F1 of a free running frequency $f_0$, a secondary harmonic component F2 of a frequency $2f_0$ and a tertiary harmonic component F3 of a frequency $3f_0$ appear in the output terminal 152 of the ring oscillator, that is, in the output terminal 152 of the injection locked frequency divider 102 (see FIG. 12).

Next, when an injection signal I1 near the frequency $3f_0$ is input to the input terminal 151, an output signal I2 in which the injection signal I1 has been down-converted appears near the free running frequency $f_0$ due to mixing of the injection signal I1 and the secondary harmonic component F2. Thus, the free running signal F1 of the injection locked frequency divider 102 is attracted toward the frequency of the output signal I2 and synchronized.

Therefore, when the injection signal I1 near the frequency $3f_0$ is input to the input terminal 151, the injection locked frequency divider 102 outputs the output signal I2 near the free running frequency $f_0$ to the output terminal 152, and operates as a divider which divides the frequency into ⅓.

In the embodiment, the injection signal input to the input terminal 151 is supplied to the gate terminal of the first N-channel MOS type transistor 161. When the voltage amplitude of the injection signal is large, the first N-channel MOS type transistor 161 turns off so that a drain current cannot flow therein.

In the embodiment, however, the predetermined DC gate bias voltage Vcont is supplied to the gate terminal of the second N-channel MOS type transistor 162 to which the injection signal is not input. Therefore, a drain current flows into the second N-channel MOS type transistor 162. That is, in the injection locked frequency divider 102, the second N-channel MOS type transistor 162 operates as a current source.

As a result, the injection locked frequency divider 102 can reduce a distortion component appearing in the drain voltage amplitude and the drain current in each amplification circuit 141A, 142A, 143A even when the voltage amplitude of the injection signal input to the input terminal 151 is large.

From above, the injection locked frequency divider 102 according to the embodiment includes a ring oscillator, a first N-channel MOS type transistor 161 and a second N-channel MOS type transistor 162. In the ring oscillator, a three-stage cascade connection of the first amplification circuit 141A, the second amplification circuit 142A and the third amplification circuit 143A is formed on a loop. An injection signal (high frequency signal) is input to the gate terminal of the first N-channel MOS type transistor 161, and further a DC gate bias voltage Vcont is supplied to the gate terminal of the second N-channel MOS type transistor 162.

Further, the drain terminal of the first N-channel MOS type transistor 161, the drain terminal of the second N-channel MOS type transistor 162 and the source terminals of the N-channel MOS type transistors 111, 121, 131 in each amplification circuit 141A to 143A are connected.

Thus, in the injection locked frequency divider 102, the high frequency signal is input to the first N-channel MOS type transistor 161, and the second N-channel MOS type transistor 162 to which the high frequency signal is not input is operated as a current source. Accordingly, even when the voltage amplitude of the injection signal is larger than a predetermined value, a drain current flows so that the bandwidth of an operation frequency as a divider can be widened. For example, the injection locked frequency divider 102 shown in FIG. 8 can operate within a wide band as a divider which divides the frequency of an injection signal into ⅓ even when the voltage amplitude of the injection signal is larger than the predetermined value.

In addition, the circuit configuration of the injection locked frequency divider 102 according to the embodiment is so simple that the circuit scale can be prevented from increasing and the number of parts can be reduced, as compared with the background art injection locked frequency divider (for example, the injection locked frequency divider 10 shown in FIG. 8).

Although the embodiment has been described on the assumption that the number of stages of amplification circuits constituting a ring oscillator is three, the number of stages is not limited to three. For example, the number of stages of amplification circuits constituting a ring oscillator may be set at (2n+1). In the injection locked frequency divider 100, the frequency of an injection signal input to the input terminal 151 may be set near a frequency which is about m(2n+1) times as high as the free running frequency $f_0$ of the ring oscillator.

For example, when the number of stages of amplification circuits constituting a ring oscillator is five, a signal whose frequency is 5 or 10 times as high as the free running frequency of the ring oscillator is injected in the injection locked frequency divider 102. As a result, the injection locked frequency divider 102 obtains a similar effect to that in the aforementioned three-stage configuration.

In addition, although the embodiment has been described as to an injection locked frequency divider, a similar effect is obtained, for example, in the case of an injection locked frequency multiplier which is synchronized with a harmonic component of an injection signal. The injection locked frequency multiplier has a similar circuit configuration to that of the injection locked frequency divider 102 shown in FIG. 8. For example, the number of stages of amplification circuits constituting a ring oscillator may be set at (2n+1), and the frequency of an injection signal input to the input terminal 151 may be set near a frequency which is about 1/(m(2n+1)) times as high as the free running frequency $f_0$ of the ring oscillator. Thus, the injection locked frequency multiplier 102X can operate as a multiplier which multiplies the frequency by m(2n+1).

The injection locked oscillator according to the present disclosure operates as an injection locked frequency divider when the injection locked oscillator is synchronized with an injection signal whose frequency is higher than the free running frequency $f_0$, and operates as an injection locked frequency multiplier when the injection locked oscillator is synchronized with an injection signal whose frequency is lower than the free running frequency $f_0$.

(Fifth Embodiment)

FIG. 9 is a diagram showing the circuit configuration of an injection locked frequency divider 103 according to a fifth embodiment. In the injection locked frequency divider 103 shown in FIG. 9, the same circuit constituents as those in the injection locked frequency divider 102 shown in FIG. 8 are referenced correspondingly, and description thereof will be omitted or simplified while different contents will be explained.

The injection locked frequency divider 103 shown in FIG. 9 includes a ring oscillator, an input terminal 151, an output terminal 152, a control voltage terminal 153, a first N-channel MOS type transistor 161, a second N-channel MOS type transistor 162, a switch 184 and a control circuit 192. In the ring oscillator, a three-stage cascade connection of a first amplification circuit 141A, a second amplification circuit 142A and a third amplification circuit 143A is formed on a loop. Incidentally, the control circuit 192 does not have to be included as a constituent part of the injection locked frequency divider 103.

The switch 184 switches an output between an injection signal (high frequency signal) input to the input terminal 151 and a DC gate bias voltage input to the control voltage terminal 153 in accordance with a control signal output by the control circuit 192, and supplies the output to a gate terminal of the second N-channel MOS type transistor 162.

The control circuit 192 generates a control signal for inputting the injection signal or the DC gate bias voltage to the gate terminal of the second N-channel MOS type transistor 162 in accordance with the voltage amplitude of the injection signal (high frequency signal) input to the input terminal 151, and supplies the generated control signal to the switch 184.

Specifically, when the voltage amplitude of the injection signal is larger than a predetermined value $V_{SW}$, the control circuit 192 generates a control signal for inputting the DC gate bias voltage to the gate terminal of the second N-channel MOS type transistor 162, and supplies the generated control signal to the switch 184. The value $V_{SW}$ is a threshold value predetermined in the injection locked frequency divider 103.

On the other hand, when the voltage amplitude of the injection signal is not larger than the predetermined value $V_{SW}$, the control circuit 192 generates a control signal for inputting the injection signal to the gate terminal of the second N-channel MOS type transistor 162, and supplies the generated control signal to the switch 184.

Next, the operation of the injection locked frequency divider 103 according to the embodiment will be described.

When there is no injection signal input to the input terminal 151, a free running signal F1 of a free running frequency $f_0$, a secondary harmonic component F2 of a frequency $2f_0$ and a tertiary harmonic component F3 of a frequency $3f_0$ appear in the output terminal 152 of the ring oscillator, that is, in the output terminal 152 of the injection locked frequency divider 103 (see FIG. 12).

Next, when an injection signal I1 near the frequency $3f_0$ is input to the input terminal 151, an output signal I2 in which the injection signal I1 has been down-converted appears near the free running frequency $f_0$ due to mixing of the injection signal I1 and the secondary harmonic component F2. Thus, the free running signal F1 of the injection locked frequency divider 103 is attracted toward the frequency of the output signal I2 and synchronized.

Therefore, when the injection signal I1 near the frequency $3f_0$ is input to the input terminal 151, the injection locked frequency divider 103 outputs the output signal I2 near the free running frequency $f_0$ to the output terminal 152, and operates as a divider which divides the frequency into ⅓.

In the embodiment, when the switch 184 supplies the injection signal to the gate terminal of the second N-channel MOS type transistor 162 in accordance with the control signal generated by the control circuit 192, the injection signal is input to the first N-channel MOS type transistor 161 and the second N-channel MOS type transistor 162 in the injection locked frequency divider 103.

In the injection locked frequency divider 103, when the voltage amplitude of an injection signal is smaller than the predetermined value $V_{SW}$, reduction in operation frequency bandwidth as a divider can be suppressed at $V_L$ in which the voltage amplitude of the injection signal is smaller than the predetermined value $V_{SW}$, in the same manner as in the injection locked frequency divider 101 shown in FIG. 4.

On the other hand, when the switch 184 supplies the DC gate bias voltage to the gate terminal of the second N-channel MOS type transistor 162 in accordance with the control signal generated by the control circuit 192, the circuit configuration of the injection locked frequency divider 103 is equivalent to the circuit configuration of the injection locked frequency divider 102 according to the fourth embodiment.

From above, the injection locked frequency divider 103 according to the embodiment further includes the switch 184 and the control circuit 192 in addition to the circuit configuration of the injection locked frequency divider 102 according to the fourth embodiment. Due to switching in the switch 184 in accordance with the magnitude of the voltage amplitude of the injection signal input to the input terminal 151, the injection locked frequency divider 103 obtains a similar circuit configuration to that of the injection locked frequency divider 102 according to the fourth embodiment when the voltage amplitude of the injection signal is larger than the predetermined value $V_{SW}$. When the voltage amplitude of the injection signal is not larger than the predetermined value $V_{SW}$, the injection signal is supplied to the gate terminals of the first N-channel MOS type transistor 161 and the second N-channel MOS type transistor 162.

As a result, in the injection locked frequency divider 103, the maximum value of the voltage amplitude of the injection signal can be increased from $V_1$ to $V_2$ when the voltage amplitude of the injection signal is larger than the predetermined value $V_{SW}$. Thus, the injection locked frequency divider 103 can operate as a divider even when the voltage amplitude of the injection signal is large. On the other hand, when the voltage amplitude of the injection signal is not larger than the predetermined value $V_{SW}$, the injection locked frequency divider 103 can suppress reduction in operation frequency bandwidth as a divider. Accordingly, the injection locked frequency divider 103 according to the embodiment can widen the operation frequency bandwidth as a divider as compared with the injection locked frequency divider 102 according to the fourth embodiment.

Although the embodiment has been described on the assumption that the number of stages of amplification circuits constituting a ring oscillator is three, the number of stages is not limited to three. For example, the number of stages of amplification circuits constituting a ring oscillator may be set at (2n+1). In the injection locked frequency divider 103, the frequency of an injection signal input to the input terminal 151 may be set near a frequency which is about m(2n+1) times as high as the free running frequency $f_0$ of the ring oscillator.

For example, when the number of stages of amplification circuits constituting a ring oscillator is five, a signal whose frequency is 5 or 10 times as high as the free running frequency of the ring oscillator is injected in the injection locked frequency divider 103. As a result, the injection locked frequency divider 103 obtains a similar effect to that in the aforementioned three-stage configuration.

In addition, although the embodiment has been described as to an injection locked frequency divider, a similar effect is obtained, for example, in the case of an injection locked frequency multiplier which is synchronized with a harmonic component of an injection signal. The injection locked frequency multiplier has a similar circuit configuration to that of the injection locked frequency divider 103 shown in FIG. 9. For example, the number of stages of amplification circuits constituting a ring oscillator may be set at (2n+1), and the frequency of an injection signal input to the input terminal 151 may be set near a frequency which is about $1/(m(2n+1))$ times as high as the free running frequency $f_0$ of the ring oscillator. Thus, the injection locked frequency multiplier 103X can operate as a multiplier which multiplies the frequency by m(2n+1).

The injection locked oscillator according to the present disclosure operates as an injection locked frequency divider when the injection locked oscillator is synchronized with an injection signal whose frequency is higher than the free running frequency $f_0$, and operates as an injection locked frequency multiplier when the injection locked oscillator is synchronized with an injection signal whose frequency is lower than the free running frequency $f_0$.

(Sixth Embodiment)

Figure 10:
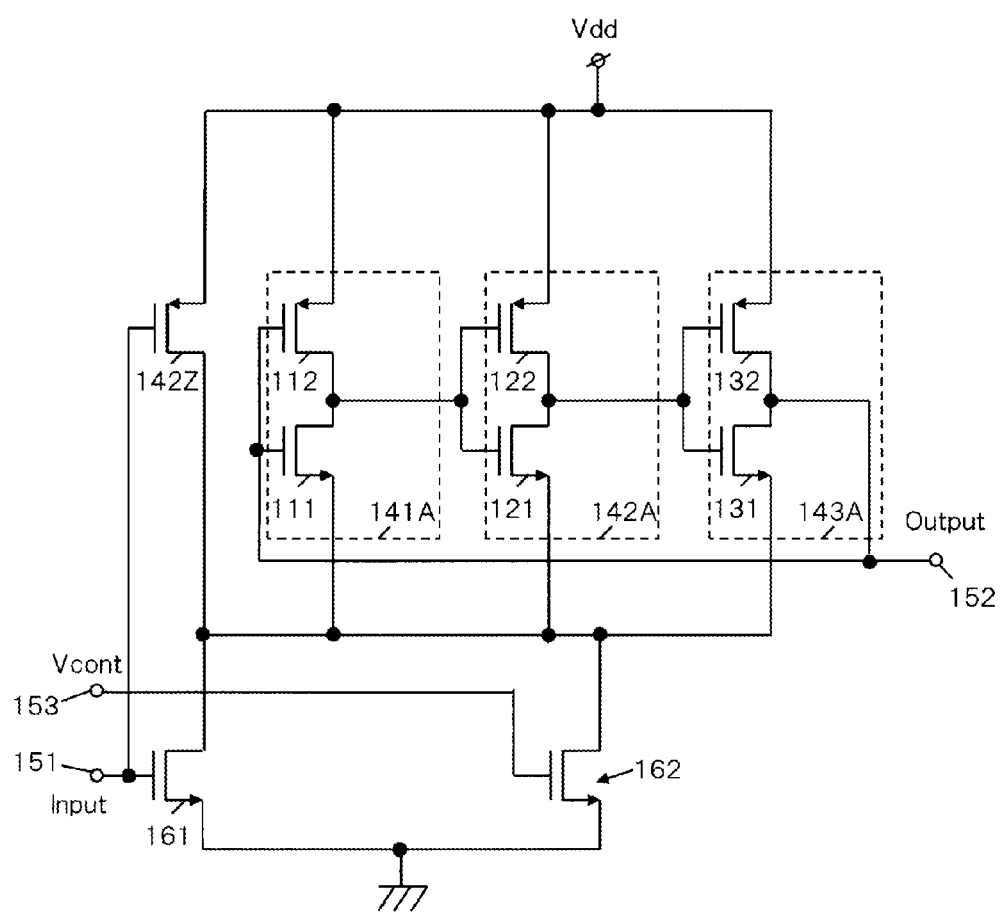
FIG. 10 is a diagram showing the circuit configuration of an injection locked frequency divider according to a sixth embodiment.

FIG. 10 is a diagram showing the circuit configuration of an injection locked frequency divider 105 according to a sixth embodiment. In the injection locked frequency divider 105 shown in FIG. 10, the same circuit constituents as those in the injection locked frequency divider 102 shown in FIG. 8 are referenced correspondingly, and description thereof will be omitted or simplified while different contents will be explained.

The injection locked frequency divider 105 shown in FIG. 10 includes a ring oscillator, an input terminal 151, an output terminal 152, a control voltage terminal 153, a first N-channel MOS type transistor 161, a second N-channel MOS type transistor 162 and a P-channel MOS type transistor 142Z. In the ring oscillator, a three-stage cascade connection of a first amplification circuit 141A, a second amplification circuit 142A and a third amplification circuit 143A is formed on a loop.

The gate and drain of the P-channel MOS type transistor 142Z are connected to the gate and drain of the first N-channel MOS type transistor 161 respectively. On the other hand, the source of the P-channel MOS type transistor 142Z is connected to a power supply.

Next, the operation of the injection locked frequency divider 105 according to the embodiment will be described.

When there is no injection signal input to the input terminal 151, a free running signal F1 of a free running frequency $f_0$, a secondary harmonic component F2 of a frequency $2f_0$ and a tertiary harmonic component F3 of a frequency $3f_0$ appear in the output terminal 152 of the ring oscillator, that is, in the output terminal 152 of the injection locked frequency divider 105 (see FIG. 12).

Next, when an injection signal I1 near the frequency $3f_0$ is input to the input terminal 151, an output signal I2 in which the injection signal I1 has been down-converted appears near the free running frequency $f_a$ due to mixing of the injection signal I1 and the secondary harmonic component F2. Thus, the free running signal F1 of the injection locked frequency divider 105 is attracted toward the frequency of the output signal I2 and synchronized.

Therefore, when the injection signal I1 near the frequency $3f_0$ is input to the input terminal 151, the injection locked frequency divider 105 outputs the output signal I2 near the free running frequency $f_0$ to the output terminal 152, and operates as a divider which divides the frequency into ⅓.

In the embodiment, the input signal is amplified and injected because the first N-channel MOS type transistor 161 connected to the input terminal and the P-channel MOS type transistor 142Z operate as an inverter amplifier. In addition, the injection signal is not supplied to the gate of the second N-channel MOS type transistor 162 serving as a current source of the injection locked frequency divider 105. Therefore, a drain current flows so stably that a distortion component in the drain voltage amplitude and the drain current in each amplification circuit 141A, 142A, 143A can be reduced.

From above, the injection locked frequency divider 105 according to the embodiment further includes the P-channel MOS type transistor 142Z in addition to the circuit configuration of the injection locked frequency divider 102 according to the fourth embodiment.

As a result, in the injection locked frequency divider 105, the input signal is amplified and injected because the N-channel MOS type transistor 161 connected to the input terminal and the P-channel MOS type transistor 142Z operate as an inverter amplifier. In addition, the injection signal is not supplied to the gate of the second N-channel MOS type transistor 162 serving as a current source of the injection locked frequency divider 105. Therefore, a drain current flows so stably that the injection locked frequency divider 105 can widen the operation frequency bandwidth as a divider and can operate within a wide band as a divider which divides the frequency of an injection signal into ⅓ even when the voltage amplitude of the injection signal is large.

Although the embodiment has been described on the assumption that the number of stages of amplification circuits constituting a ring oscillator is three, the number of stages is not limited to three. For example, the number of stages of amplification circuits constituting a ring oscillator may be set at (2n+1). In the injection locked frequency divider 105, the frequency of an injection signal input to the input terminal 151 may be set near a frequency which is about m(2n+1) times as high as the free running frequency $f_0$ of the ring oscillator.

For example, when the number of stages of amplification circuits constituting a ring oscillator is five, a signal whose frequency is 5 or 10 times as high as the free running frequency of the ring oscillator is injected in the injection locked frequency divider 105. As a result, the injection locked frequency divider 105 obtains a similar effect to that in the aforementioned three-stage configuration.

In addition, although the embodiment has been described as to an injection locked frequency divider, a similar effect is obtained, for example, in the case of an injection locked frequency multiplier 105X which is synchronized with a harmonic component of an injection signal. The injection locked frequency multiplier 105X has a similar circuit configuration to that of the injection locked frequency divider 105 shown in FIG. 10. For example, the number of stages of amplification circuits constituting a ring oscillator may be set at (2n+1), and the frequency of an injection signal input to the input terminal 151 may be set near a frequency which is about 1/(m(2n+1)) times as high as the free running frequency $f_0$ of the ring oscillator. Thus, the injection locked frequency multiplier 105X can operate as a multiplier which multiplies the frequency by m(2n+1).

The injection locked oscillator according to the present disclosure operates as an injection locked frequency divider when the injection locked oscillator is synchronized with an injection signal whose frequency is higher than the free running frequency $f_0$, and operates as an injection locked frequency multiplier when the injection locked oscillator is synchronized with an injection signal whose frequency is lower than the free running frequency $f_0$.

Various embodiments have been described above with reference to the drawings. It is a matter of course that the present disclosure is not limited to such embodiments. It is obvious for those in the art to think of various possible ideas as to change examples or modification examples within the scope stated in the claims. Not to say, it is understood that those ideas are to belong to the technical scope of the present disclosure.

The present application is based on Japanese Patent Application (Japanese Patent Application No. 2013-043497) filed on Mar. 5, 2013, the contents of which are incorporated herein by reference.

INDUSTRIAL APPLICABILITY

The present disclosure is useful as an injection locked oscillator which is, for example, used in a PLL circuit, and which operates stably as an oscillator and widen an operation frequency even when the amplitude of an injection signal is larger than a predetermined value.

REFERENCE SIGNS LIST 100,101,102,103,104,105 injection locked frequency divider
100X,101X,102X,103X,104X,105X injection locked frequency multiplier
111,121,131,161,162 N-channel MOS type transistor
112,113,122,123,132,133,142Z P-channel MOS type transistor
41,141,141A first amplification circuit
42,142,142A second amplification circuit
43,143,143A third amplification circuit
181,182,183,184 switch
191,192 control circuit

The invention claimed is:

1. An injection locked oscillator comprising:
a ring oscillator including a cascade connection of (2n+1) stages (n is an integer of 1 or more) of amplification circuits each having an N-channel MOS type transistor, a first P-channel MOS type transistor and a second P-channel MOS type transistor,
wherein an in-phase high frequency signal is input to every gate terminal of the first P-channel MOS type transistors in the (2n+1) amplification circuits; and
wherein a predetermined DC control voltage is supplied to a gate terminal of the second P-channel MOS type transistor in each of the (2n+1) amplification circuits.

2. An injection locked oscillator comprising:
a ring oscillator including a cascade connection of (2n+1) stages (n is an integer of 1 or more) of amplification circuits each having an N-channel MOS type transistor, a first P-channel MOS type transistor and a second P-channel MOS type transistor; and
switches which are provided for the amplification circuits respectively so that a predetermined DC control voltage to be input to a gate terminal of the second P-channel MOS type transistor in each of the amplification circuits is switched to a high frequency signal and the high frequency signal is supplied thereto in accordance with the amplitude of the high frequency signal,
wherein the high frequency signal is input to a gate terminal of the first P-channel MOS type transistor in each of the (2n+1) amplification circuits, and
wherein the predetermined DC control voltage is supplied to the gate terminal of the second P-channel MOS type transistor in each of the (2n+1) amplification circuits.

3. An injection locked oscillator comprising:
a ring oscillator including a cascade connection of (2n+1) stages (n is an integer of 1 or more) of amplification circuits each having an N-channel MOS type transistor and a P-channel MOS type transistor;

a first N-channel MOS type transistor which is directly connected to every source terminal of the N-channel MOS type transistors in the (2n+1) amplification circuits; and
a second N-channel MOS type transistor which is directly connected to every source terminal of the N-channel MOS type transistors in the (2n+1) amplification circuits;
wherein a high frequency signal is input to a gate terminal of the first N-channel MOS type transistor; and
wherein a predetermined DC control voltage is supplied to a gate terminal of the second N-channel MOS type transistor.

4. An injection locked oscillator comprising:
a ring oscillator including a cascade connection of (2n+1) stages (n is an integer of 1 or more) of amplification circuits each having an N-channel MOS type transistor and a P-channel MOS type transistor;
a first N-channel MOS type transistor which is connected to the N-channel MOS type transistor in each of the (2n+1) amplification circuits;
a second N-channel MOS type transistor which is connected to the N-channel MOS type transistor in each of the (2n+1) amplification circuits; and
a switch by which a predetermined DC control voltage to be input to a gate terminal of the second N-channel MOS type transistor is switched to a high frequency signal and the high frequency signal is supplied thereto in accordance with the amplitude of the high frequency signal,
wherein the high frequency signal is input to a gate terminal of the first N-channel MOS type transistor; and
wherein the predetermined DC control voltage is supplied to the gate terminal of the second N-channel MOS type transistor.

5. An injection locked oscillator comprising:
a ring oscillator including a cascade connection of (2n+1) stages (n is an integer of 1 or more) of amplification circuits each having an N-channel MOS type transistor, a first P-channel MOS type transistor and a second P-channel MOS type transistor,
wherein a high frequency signal is input to a gate terminal of the first P-channel MOS type transistor in each of the (2n+1) amplification circuits,
wherein a predetermined DC control voltage is supplied to a gate terminal of the second P-channel MOS type transistor in each of the (2n+1) amplification circuits, and
wherein an injection signal whose frequency is m(2n+1) (m is an integer of 1 or more) times or (2n+1)/m times as high as an oscillation frequency of the ring oscillator is input to the gate terminal of each of the first P-channel MOS type transistors in the (2n+1) amplification circuits.

6. An injection locked oscillator comprising:
a ring oscillator including a cascade connection of (2n+1) stages (n is an integer of 1 or more) of amplification circuits each having an N-channel MOS type transistor and a P-channel MOS type transistor;
a first N-channel MOS type transistor which is connected to the N-channel MOS type transistor in each of the (2n+1) amplification circuits; and
a second N-channel MOS type transistor which is connected to the N-channel MOS type transistor in each of the (2n+1) amplification circuits,
wherein a high frequency signal is input to a gate terminal of the first N-channel MOS type transistor,
wherein a predetermined DC control voltage is supplied to a gate terminal of the second N-channel MOS type transistor, and
wherein an injection signal whose frequency is m(2n+1)(m is an integer of 1 or more) times or (2n+1)/m times as high as an oscillation frequency of the ring oscillator is input to the gate terminal of the first N-channel MOS type transistor.

* * * * *